(12) United States Patent
VanGilder et al.

(10) Patent No.: US 8,996,180 B2
(45) Date of Patent: Mar. 31, 2015

(54) SYSTEM AND METHOD FOR PREDICTING PERFORATED TILE AIRFLOW IN A DATA CENTER

(75) Inventors: James W. VanGilder, Pepperell, MA (US); Zachary R. Sheffer, Boston, MA (US); Xuanhang Zhang, Tewksbury, MA (US)

(73) Assignee: Schneider Electric IT Corporation, West Kingston, RI (US)

( * ) Notice: Subject to any disclaimer, the term of this patent is extended or adjusted under 35 U.S.C. 154(b) by 290 days.

(21) Appl. No.: 12/884,832

(22) Filed: Sep. 17, 2010

(65) Prior Publication Data

US 2012/0071992 A1 Mar. 22, 2012

(51) Int. Cl.
*G05D 7/00* (2006.01)
*H05K 7/20* (2006.01)

(52) U.S. Cl.
CPC ........ *H05K 7/20745* (2013.01); *H05K 7/20836* (2013.01)
USPC .......................................... 700/282; 700/276

(58) Field of Classification Search
USPC ......................................................... 700/276
See application file for complete search history.

(56) References Cited

U.S. PATENT DOCUMENTS

| | | | |
|---|---|---|---|
| 4,823,290 A | 4/1989 | Fasack et al. | |
| 5,095,712 A | 3/1992 | Narreau | |
| 5,216,623 A | 6/1993 | Barrett et al. | |
| 5,367,670 A | 11/1994 | Ward et al. | |
| 5,404,136 A | 4/1995 | Marsden | |
| 5,410,448 A * | 4/1995 | Barker et al. | 361/695 |
| 5,462,225 A | 10/1995 | Massara et al. | |
| 5,581,478 A | 12/1996 | Cruse et al. | |
| 5,682,949 A | 11/1997 | Ratcliffe et al. | |
| 5,718,628 A | 2/1998 | Nakazato et al. | |
| 5,735,134 A | 4/1998 | Liu et al. | |

(Continued)

FOREIGN PATENT DOCUMENTS

| | | |
|---|---|---|
| CN | 1485906 A | 3/2004 |
| WO | 2008144375 A2 | 11/2008 |

(Continued)

OTHER PUBLICATIONS

Anderson, Donald, "Iterative Procedures for Nonlinear Integral Equations", Journal of the Association for Computing Machinery, vol. 12, No. 4, Oct. 1965, pp. 547-560.*

(Continued)

*Primary Examiner* — Carlos Ortiz Rodriguez
(74) *Attorney, Agent, or Firm* — Lando & Anastasi, LLP

(57) ABSTRACT

Systems and methods provide determinations of airflow from a raised floor plenum. In one aspect, a computer-implemented method is provided for predicting airflow from a plurality of openings in a plenum, including determining an average air pressure in the plenum, determining an airflow value for each of the openings based on the average air pressure, dividing the plenum into a plurality of grid cells, determining a value for airflow velocity for each of the grid cells, determining an air pressure value at each of the openings based on the airflow velocity, determining a new airflow value for each one of the plurality of openings based on the air pressure value, determining whether a difference between the new airflow values and previous airflow values is greater than a threshold, and storing the new airflow value for each one of the plurality of openings as a final airflow value.

18 Claims, 15 Drawing Sheets

(56) References Cited

U.S. PATENT DOCUMENTS

| | | | |
|---|---|---|---|
| 5,995,729 A | 11/1999 | Hirosawa et al. |
| 6,055,480 A | 4/2000 | Nevo et al. |
| 6,134,511 A | 10/2000 | Subbarao |
| 6,216,956 B1 | 4/2001 | Ehlers et al. |
| 6,246,969 B1 | 6/2001 | Sinclair et al. |
| 6,494,050 B2 | 12/2002 | Spinazzola et al. |
| 6,574,104 B2 | 6/2003 | Patel et al. |
| 6,575,234 B2 | 6/2003 | Nelson |
| 6,672,955 B2 | 1/2004 | Charron |
| 6,694,759 B1 | 2/2004 | Bash et al. |
| 6,718,277 B2 | 4/2004 | Sharma |
| 6,745,579 B2 | 6/2004 | Spinazzola et al. |
| 6,827,142 B2 | 12/2004 | Winkler et al. |
| 6,862,179 B2 | 3/2005 | Beitelmal et al. |
| 6,881,142 B1 | 4/2005 | Nair |
| 6,886,353 B2 | 5/2005 | Patel et al. |
| 7,020,586 B2 | 3/2006 | Snevely |
| 7,031,870 B2 | 4/2006 | Sharma et al. |
| 7,051,946 B2 | 5/2006 | Bash et al. |
| 7,085,133 B2 | 8/2006 | Hall |
| 7,148,796 B2 | 12/2006 | Joy et al. |
| 7,251,547 B2 | 7/2007 | Bash et al. |
| 7,313,503 B2 | 12/2007 | Nakagawa et al. |
| 7,315,448 B1 | 1/2008 | Bash et al. |
| 7,365,973 B2 | 4/2008 | Rasmussen et al. |
| 7,366,632 B2 | 4/2008 | Hamann et al. |
| 7,378,165 B2 | 5/2008 | Brignone et al. |
| 7,403,391 B2 | 7/2008 | Germagian et al. |
| 7,426,453 B2 | 9/2008 | Patel et al. |
| 7,472,043 B1 | 12/2008 | Low et al. |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,620,480 B2 | 11/2009 | Patel et al. |
| 7,676,280 B1 | 3/2010 | Bash et al. |
| 7,726,144 B2 | 6/2010 | Larson et al. |
| 7,799,474 B2 | 9/2010 | Lyon et al. |
| 7,881,910 B2 | 2/2011 | Rasmussen et al. |
| 7,885,795 B2 | 2/2011 | Rasmussen et al. |
| 7,908,126 B2 | 3/2011 | Bahel et al. |
| 7,975,156 B2 | 7/2011 | Artman et al. |
| 7,979,250 B2 | 7/2011 | Archibald et al. |
| 7,991,592 B2 | 8/2011 | VanGilder et al. |
| 8,155,922 B2 | 4/2012 | Loucks |
| 8,219,362 B2 | 7/2012 | Shrivastava et al. |
| 8,229,713 B2 | 7/2012 | Hamann et al. |
| 8,244,502 B2 | 8/2012 | Hamann et al. |
| 8,249,825 B2 | 8/2012 | VanGilder et al. |
| 8,315,841 B2 | 11/2012 | Rasmussen et al. |
| 8,425,287 B2 | 4/2013 | Wexler |
| 8,473,265 B2 | 6/2013 | Hlasny et al. |
| 8,509,959 B2 | 8/2013 | Zhang et al. |
| 2001/0042616 A1 | 11/2001 | Baer |
| 2002/0043969 A1 | 4/2002 | Duncan et al. |
| 2002/0071031 A1 | 6/2002 | Lord et al. |
| 2002/0124081 A1 | 9/2002 | Primm et al. |
| 2002/0149911 A1 | 10/2002 | Bishop et al. |
| 2003/0115000 A1 | 6/2003 | Bodas |
| 2003/0115024 A1 | 6/2003 | Snevely |
| 2003/0158718 A1 | 8/2003 | Nakagawa et al. |
| 2004/0020224 A1 | 2/2004 | Bash et al. |
| 2004/0031280 A1 | 2/2004 | Martin et al. |
| 2004/0065097 A1 | 4/2004 | Bash et al. |
| 2004/0065104 A1 | 4/2004 | Bash et al. |
| 2004/0075984 A1 | 4/2004 | Bash et al. |
| 2004/0083012 A1 | 4/2004 | Miller |
| 2004/0089009 A1 | 5/2004 | Bash et al. |
| 2004/0089011 A1 | 5/2004 | Patel et al. |
| 2004/0163001 A1 | 8/2004 | Bodas |
| 2004/0189161 A1 | 9/2004 | Davis et al. |
| 2004/0240514 A1 | 12/2004 | Bash et al. |
| 2004/0262409 A1 | 12/2004 | Crippen et al. |
| 2005/0023363 A1 | 2/2005 | Sharma et al. |
| 2005/0267639 A1 | 12/2005 | Sharma et al. |
| 2006/0080001 A1 | 4/2006 | Bash et al. |
| 2006/0096306 A1 | 5/2006 | Okaza et al. |
| 2006/0115586 A1 | 6/2006 | Xing et al. |
| 2006/0121421 A1 | 6/2006 | Spitaels et al. |
| 2006/0168975 A1 | 8/2006 | Malone et al. |
| 2006/0214014 A1 | 9/2006 | Bash et al. |
| 2007/0038414 A1 | 2/2007 | Rasmussen et al. |
| 2007/0078634 A1 | 4/2007 | Krishnapillai |
| 2007/0078635 A1 | 4/2007 | Rasmussen et al. |
| 2007/0085678 A1 | 4/2007 | Joy et al. |
| 2007/0121295 A1 | 5/2007 | Campbell et al. |
| 2007/0171613 A1 | 7/2007 | McMahan et al. |
| 2007/0174024 A1 | 7/2007 | Rasmussen et al. |
| 2007/0190919 A1 | 8/2007 | Donovan et al. |
| 2007/0274035 A1 | 11/2007 | Fink et al. |
| 2008/0004837 A1 | 1/2008 | Zwinger et al. |
| 2008/0041076 A1 | 2/2008 | Tutunoglu et al. |
| 2008/0104985 A1 | 5/2008 | Carlsen |
| 2008/0105412 A1 | 5/2008 | Carlsen et al. |
| 2008/0144375 A1 | 6/2008 | Cheng |
| 2008/0174954 A1 | 7/2008 | VanGilder et al. |
| 2008/0180908 A1 | 7/2008 | Wexler |
| 2009/0030554 A1 | 1/2009 | Bean, Jr. et al. |
| 2009/0138313 A1 | 5/2009 | Morgan et al. |
| 2009/0138888 A1 | 5/2009 | Shah et al. |
| 2009/0150123 A1 | 6/2009 | Archibald et al. |
| 2009/0205416 A1 | 8/2009 | Campbell et al. |
| 2009/0223234 A1 | 9/2009 | Campbell et al. |
| 2009/0259343 A1 | 10/2009 | Rasmussen et al. |
| 2009/0326879 A1 | 12/2009 | Hamann et al. |
| 2009/0326884 A1 | 12/2009 | Amemiya et al. |
| 2010/0106464 A1 | 4/2010 | Hlasny et al. |
| 2010/0256959 A1 | 10/2010 | VanGilder et al. |
| 2010/0286956 A1 | 11/2010 | VanGilder et al. |
| 2010/0287018 A1 | 11/2010 | Shrivastava et al. |
| 2011/0040529 A1 | 2/2011 | Hamann et al. |
| 2011/0246147 A1 | 10/2011 | Rasmussen et al. |
| 2012/0071992 A1 | 3/2012 | VanGilder et al. |
| 2012/0158387 A1 | 6/2012 | VanGilder et al. |
| 2012/0170205 A1 | 7/2012 | Healey et al. |
| 2013/0006426 A1 | 1/2013 | Healey et al. |
| 2013/0095494 A1 | 4/2013 | Neely |

FOREIGN PATENT DOCUMENTS

| | | |
|---|---|---|
| WO | 2009/014893 A1 | 1/2009 |
| WO | 2011/019615 A1 | 2/2011 |

OTHER PUBLICATIONS

Karki et al., "Techniques for controlling airflow distribution in raised-floor data centers", ASME 2003.*

"Case Study, Application of TileFlow to Improve Cooling in a Data Center", Innovative Research, Inc., 2004.*

"Management Strategy for Network Critical Physical Infrastructure", White Paper #100, pp. 110, American Power Conversion, Dec. 15, 2003, published on World Wide Web.

Abi-Zadeh, Davar et al., "A Transient Analysis of Environmental Conditions for a Mission Critical Facility after a Failure of Power", Arup Mission Criticial Facilities, Feb. 2001, pp. 1-12.

Ahmad, Jasim U. et al., "Navier-Stokes simulation of air-conditioning facility of a large modern computer room," Jun. 2005, Proceedings of the 2005 ASME Fluids Engineering Division Summer Meeting and Exhibition, pp. 1-6.

APC User's Guide Brochure, "InfraStruXure Manager," Mar. 2004, 181 pgs.

ASHRAE, "Thermal Guidelines for Data Processing Environments" 2004, Atlanta: American Society of Heating, Refrigerating, and Air-Conditioning Engineers, Inc., 2004, Atlanta.

Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.

Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s10619-005-0413-0.

(56) References Cited

OTHER PUBLICATIONS

Chandrakant D. Patel, et al., "Thermal Considerations in Cooling Large Scale High Copute Density Data Centers" IEEE 2002, pp. 767-776.
Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.
Ehsan Pakabaznia et al., "Miminizing data center cooling and server power costs", Proceedings of the 14th ACM/IEEE International Symposium on Low Power Electronics and Design, ISLPED '09, Jan. 1, 2009, p. 145, XP55015368, New York, New York, USA, DOI: 10.1145/1594233.1594268, ISBN: 978-1-60-558684-7.
Herrlin, M.K., "Rack Cooling Effectiveness in Data Centers and Telecom Central Offices: The Rack Cooling Index (RCI)," ASHRAE Transaction, 2005, pp. 725-731, vol. 111(2).
Innovative Research, Inc., http://web.archive.org/web/20051221005029/http://www.inres.com/, Dec. 21, 2005, published on World Wide Web.
International Search Report for PCT/US2006/16739 mailed Oct. 3, 2006.
International Search Report for PCT/US2008/51908 mailed Jul. 3, 2008.
Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007, pp. 193-225, XP019499845, ISSN: 1573-7578, DOI:10.1007/S10619-006-7007-3.
Jeonghwan Choi et al., "A CFD-Based Tool for Studying Temperature in Rack-Mounted Servers", IEEE Transactions on Computers, IEEE Service Center, Los Alamitos, CA, US, vol. 57, No. 8, Aug. 1, 2008, pp. 1129-1142, ISSN: 0018-9340, DOI: 10.1109/TC.2008.52.
K. Dunlap, "Cooling Audit for Identifying Potential Cooling Problems in Data Centers", White Paper #40, pp. 1-18, American Power Conversion, May 20, 2004, published on World Wide Web.
Karki et al., "Techniques for controlling airflow distribution in raised-floor data centers," ASME 2003.
Marwah, M.; Sharma, R.; Shih, R.; Patel, C.; Bhatia, V.; Mekanapurath, M.; Velumani, R.; Velayudhan, S., 2009, Data analysis, visualization and knowledge discovery in sustainable data centers, in Proceedings of the 2nd Bangalore Annual Compute Conference (COMPUTE '09).
N. Rasmussen, "Calculating Total Cooling Requirements for Data Centers", White Paper #25, pp. 1-8, American Power Conversion, May 20, 2004, published on World Wide Web.
N. Rasmussen, "Cooling Strategies for Ultra-High Density Racks and Blade Servers", White Paper #46, pp. 1-22, American Power Conversion, Mar. 29, 2005, published on World Wide Web.
N. Rasmussen, "Strategies for Deploying Blade Servers in Existing Data Centers", White Paper #125, pp. 1-14, American Power Conversion, Mar. 29, 2005, published on World Wide Web.
Pakbaznia, E.; Ghasemazar, M.; Pedram, M.:, "Temperature-aware dynamic resource provisioning in a power-optimized datacenter," Design, Automation & Test in Europe Conference & Exhibition (DATE), 2010, Vol., No., pp. 124-129, Mar. 8-12, 2010.
Refai-Ahmed G. et al., "Analysis of flow distribution in power supply using flow network modeling (FNM)", Thermal and Thermomechanical Phenomena in Electronic Systems, 2000, IT HERM 2000, The Seventh Intersociety Conference on May 23-26, 2000, Piscataway, NJ, USA, IEEE, Piscataway, NJ, USA, vol. 1, May 23, 2000, pp. 90-98, ISBN: 978-0-7803-5912-3.
Sharma, R.K, Bash, C.E., and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.
Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.
Shrivastava S.K. et al., "A flow-network model for predicting rack cooling in containment systems", Proceedings of the ASME Interpack Conference—2009: Presented at 2009 ASME Interpack Conference, Jul. 19-23, 2009, San Francisco, California, USA, vol. 2, Jul. 19, 2009, pp. 785-791.
Toulouse M.M. et al., "Exploration of a potential-flow-based compact model of air-flow transport in data centers", Proceedings of the ASME International Mechanical Engineering Congress and Exposition—2009: Presented at 2009 ASME International Mechanical Engineering Congress and Exposition, Nov. 13-19, 2009, Lake Buena Vista, Florida, USA, vol. 13: New Del, vol. 13, Jan. 1, 2009, pp. 41-50, DOI: 10.1115/IMECE2009-10806, ISBN: 978-0-7918-4386-4.
Vanessa Lopez et al., "Measurement-based modeling for data centers", Thermal and Thermomechanical Phenomena in Electronic Systems (ITHERM), 2010 12th IEEE Intersociety Conference on, IEEE, Piscataway, NJ, USA, Jun. 2, 2010, pp. 1-8, XP031702357.
Vangilder et al., "Airflow Uniformity thourhg Perforated Tiles in a Raised-Floor Data Center", White Paper 121, Jul. 17-22, 2005, 10 pages.
Vangilder, James W. et al., "Caputure index: an airflow-based rack cooling performance metric," 2007, ASHRAE Transactions, vol. 113, pp. 126-136.
Vangilder, James W. et al., "Real-Time prediction of rack-cooling performance," 2006, ASHRAE Transactions, vol. 112, pp. 151-162.
International Search Report for PCT/US2011/051866 mailed Feb. 24, 2012.
Healey, C., et al., "Potential-Flow Modeling for Data Center Applications," Proceedings of the ASME 2011 Pacific Rim Technical Conference & Exposition on Packaging and Integration of Electronic and Photonic Systems, IPACK2011-52136, Jul. 6-8, 2011.
Chen, Q.and Srebric, J., "Simplified Diffuser Boundary Conditions for Numerical Room Airflow Models," Final Report for ASHRAE RP-1009, Department of Architecture, Massachusetts Institute of Technology, Cambridge, MA, 2000, 181 pages.
Bemis et al, Data Center Airflow Modeling: Helps Facilities Planners Make Informed Decisions. Applied Math Modeling Inc. 2009 [retrieved on Apr. 19, 2012]. Retrieved from the Internet: <URL: http:I/www.coolsimsoftware.com/wwwrooULinkCiick.
aspx?fileticket=r1 SqFUDtRTk%3D&tabid=189> entire document.
Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s10619-005-0413-0.

* cited by examiner

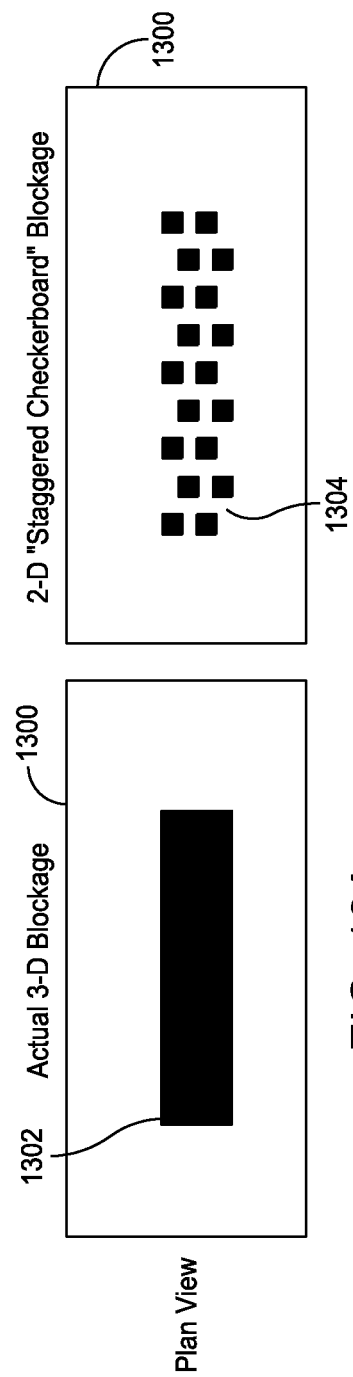

SYSTEM AND METHOD FOR PREDICTING PERFORATED TILE AIRFLOW IN A DATA CENTER

BACKGROUND OF THE INVENTION

1. Field of the Invention

At least one embodiment in accordance with the present invention relates generally to systems and methods for data center management and design, and more specifically, to systems and methods for predicting perforated tile airflow in a data center.

2. Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these connectivity, power and cooling elements. In some data center configurations, these rows are organized into hot and cool aisles to decrease the cost associated with cooling the information technology equipment. A raised floor having an air plenum beneath the floor is typically used for providing cooling air to the racks. Cool air is distributed from the air plenum to the racks through perforated tiles having open areas.

Various processes and software applications, such as the InfrastruXure® Central and the Operations Manager products available from American Power Conversion Corporation (APC) of West Kingston, R.I., have been developed to aid data center personnel in designing and maintaining efficient and effective data center configurations. These tools often guide data center personnel through activities such as designing the data center structure, positioning equipment within the data center prior to installation and repositioning equipment after construction and installation are complete. Thus, conventional tool sets provide data center personnel with a standardized and predictable design methodology.

SUMMARY OF THE INVENTION

A first aspect of the invention is directed to a computer-implemented method for predicting airflow from a plurality of openings in a plenum. The method includes (A) receiving input data from a storage device, the input data including data related to the plenum, (B) determining an average air pressure in the plenum, (C) determining an airflow value for each of the openings based on the average air pressure, (D) dividing the plenum into a plurality of grid cells, (E) using a first iterative method, determine a value for airflow velocity for each of the grid cells, (F) determining an air pressure value at each of the openings based on the airflow velocity, (G) using a second iterative method, determine a new airflow value for each one of the plurality of openings based on the air pressure value at the one of the openings, (H) determining whether a difference between the new airflow values and previous airflow values is greater than a threshold, and (I) repeating acts (E) through (H) until the difference is not greater than the threshold, and then storing the new airflow value for each one of the plurality of openings as a final airflow value.

The method may further include displaying the final airflow value for each one of the plurality of openings. In another version the method may include controlling at least one of a cooling device and an equipment rack in a data center based on at least one final airflow value. Act (D) of the method may include automatically setting a size of each of the plurality of grid cells such that at least one grid cell of the plurality of grid cells has a size different from the size of one other grid cell of the plurality of grid cells. The method may also include automatically setting a size includes determining a size of each of the plurality of grid cells based on characteristics of the plenum. Act (E) of the method may include setting a relaxation factor for the first iterative method, and using the relaxation factor in the first iterative method. The method may further include setting a limit for a number of iterations of the first iterative method based on a completed number of iterations of the second iterative method, and increasing the limit based on an increase in the completed number of iterations of the second iterative method. In the method, act (D) may include creating a two dimensional model of an obstruction in the plenum, and act (G) may include determining if airflows in the plenum satisfy a mass balance equation. The method may further include correcting a pressure value or tile airflows directly at each of the openings if the mass balance equation is not met.

A second aspect of the invention is directed to a system for evaluating airflow in a plenum of a data center. The system includes a storage device, a display, and a controller coupled to the storage device and the display and configured to: receive input data from the storage device, the input data including data related to the plenum, determine an airflow value for each of the openings based on an initial air pressure value, divide the plenum into a plurality of grid cells, use a first iterative method to determine a value for airflow velocity for each of the grid cells, and an air pressure value at each of the openings based on the airflow velocity, use a second iterative method to determine a new airflow value for each one of the plurality of openings based on the air pressure value at the one of the openings, determine whether a difference between the new airflow values and previous airflow values is greater than a threshold, and continue using the first iterative method and the second iterative method using updated values until the difference is not greater than the threshold, and then storing in the storage device the new airflow value for each one of the plurality of openings as a final airflow value.

In the system, the controller may be further configured to control the display to display the final airflow value for each one of the plurality of openings, and to control at least one device based on at least one final airflow value. The controller may also be configured to set a size of each of the plurality of grid cells such that at least one grid cell of the plurality of grid cells has a size different from the size of one other grid cell of the plurality of grid cells, wherein a size of each of the plurality of grid cells is based on characteristics of the plenum. The controller may also be configured to set a relaxation factor for the first iterative method, and use the relaxation factor in the first iterative method. The controller may be configured to set a limit for a number of iterations of the first iterative method based on a completed number of iterations of the second iterative method, and the controller is further configured to increase the limit based on an increase in the completed number of iterations of the second iterative method. The controller may also be configured to create a two dimensional model of an obstruction in the plenum.

Yet another aspect of the invention is directed to computer readable medium having stored thereon sequences of instruction including instructions that will cause a processor to: receive input data, the input data including data related to the plenum, determine an airflow value for each of the openings based on the average air pressure, divide the plenum into a plurality of grid cells, use a first iterative method to determine a value for airflow velocity for each of the grid cells, and an air pressure value at each of the openings based on the airflow velocity, use a second iterative method to determine a new airflow value for each one of the plurality of openings based on the air pressure value at the one of the openings, determine whether a difference between the new airflow values and previous airflow values is greater than a threshold, and continue using the first iterative method and the second iterative method using updated values until the difference is not greater than the threshold, and storing in the storage device the new airflow value for each one of the plurality of openings as a final airflow value.

The sequences of instruction may include instructions that will cause a processor to set a size of each of the plurality of grid cells such that at least one grid cell of the plurality of grid cells has a size different from the size of one other grid cell of the plurality of grid cells, wherein a size of each of the plurality of grid cells is based on characteristics of the plenum.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 13A, 13B and 13C show representations of a blockage in a air plenum;

DETAILED DESCRIPTION

Figure 1:
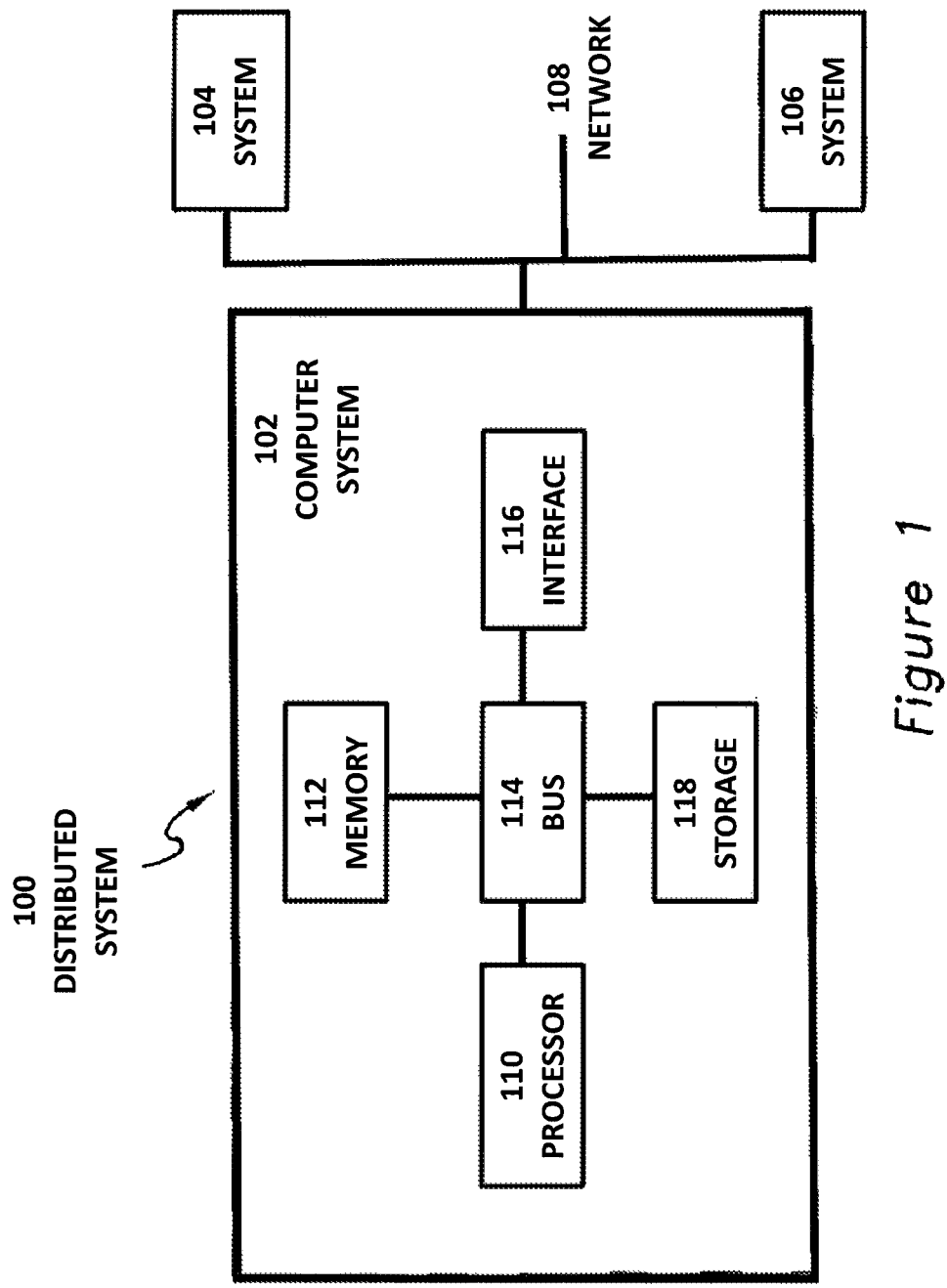
FIG. 1 shows an example computer system with which various aspects in accord with the present invention may be implemented.

At least some embodiments in accordance with the present invention relate to systems and processes through which a user may design new data center configurations and analyze, modify, manage and control existing configurations. These systems may facilitate this activity by allowing the user to create models of data center configurations from which performance metrics may be determined. Both the systems and the user may employ these performance metrics to determine alternative data center configurations that meet various design objectives. Further, in at least one embodiment, a system provides prediction of perforated tile airflow for a proposed layout of a data center equipment and also provides prediction of perforated tile airflow for an installed data center.

As described in U.S. patent application Ser. No. 12/019,109, titled "System and Method for Evaluating Equipment Rack Cooling", filed Jan. 24, 2008 (referred to herein as "the '109 application"), and in U.S. patent application Ser. No. 11/342,300, titled "Methods and Systems for Managing Facility Power and Cooling" filed Jan. 27, 2006 (referred to herein as "the '300 application"), both of which are assigned to the assignee of the present application, and both of which are hereby incorporated herein by reference in their entirety, typical equipment racks in modern data centers draw cooling air in the front of the rack and exhaust air out the rear of the rack. The equipment racks, and in-row coolers are typically arranged in rows in an alternating front/back arrangement creating alternating hot and cool aisles in a data center with the front of each row of racks facing the cool aisle and the rear of each row of racks facing the hot aisle. Adjacent rows of equipment racks separated by a cool aisle may be referred to as a cool aisle cluster, and adjacent rows of equipment racks separated by a hot aisle may be referred to as a hot aisle cluster. As readily apparent to one of ordinary skill in the art, a row of equipment racks may be part of one hot aisle cluster and one cool aisle cluster. In descriptions and claims herein, equipment in racks, or the racks themselves, may be referred to as cooling consumers, and in-row cooling units and/or computer room air conditioners (CRACs) may be referred to as cooling providers. In the referenced applications, tools are provided for analyzing the cooling performance of a cluster of racks in a data center. In these tools, multiple analyses may be performed on different layouts to attempt to optimize the cooling performance of the data center.

In a typical data center that uses CRACs to provide cooling, airflow output from the CRACs is typically distributed to equipment racks using an under-floor plenum. The CRACs pump cool air into the plenum, and the air exits the plenum through perforated floor tiles which are typically located in the front of equipment racks. For facilities employing a hot aisle/cool aisle design, the perforated tiles are typically contained in the cool aisles. In existing data center design and management tools, a detailed analysis of the airflows through perforated tiles is not typically performed, rather, some rule-of-thumb or rough estimate is used to determine the airflow that is delivered through perforated tiles, and often, a uniform airflow is assumed through each perforated tile based on the total airflow provided by CRACs and leakage airflow. The airflow data is then used in cooling calculations to design and evaluate cooling solutions for the data center. The rough estimate analyses fail to account for obstructions like cable trays and water pipes, plenum depth, perforated tile type, leakage paths, and CRAC and tile locations.

It is known to use commercially available Computational Fluid Dynamics (CFD) based software programs, such as "TileFlow" available from Innovative Research, Inc., to conduct analyses of the airflows in an under-floor plenum. However, these programs are typically extremely expensive, slow to run, and require special expertise to operate.

At least some embodiments described herein are directed to tools and methods by which perforated tile airflow performance may be estimated in real time or near real time using common computers. The tools and methods may be used in conjunction with both data center design tools and with data center management tools, and do not require high-level operators.

The aspects disclosed herein in accordance with the present invention, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. Further, computer systems in embodiments of the data center may be used to automatically measure environmental parameters in a data center, and control equipment, such as chillers or coolers to optimize performance. Moreover, the systems described herein may be configured to include or exclude any of the functions discussed herein. Thus the invention is not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accordance with the present invention may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accordance with the present invention may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accordance with the present invention may be implemented within methods, acts, systems, system elements and components using a variety of hardware and software configurations, and the invention is not limited to any particular distributed architecture, network, or communication protocol.

FIG. 1 shows a block diagram of a distributed computer system 100, in which various aspects and functions in accord with the present invention may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, ethernet, wireless ethernet, Bluetooth, TCP/IP, UDP, Http, NTP, SNMP, SMS, MMS, SS7, Json, Soap, and Corba. To ensure data transfer is secure, computer systems 102, 104 and 106 may transmit data via network 108 using a variety of security measures including TSL, SSL or VPN among other security techniques. While distributed computer system 100 illustrates three networked computer systems, distributed computer system 100 may include any number of computer systems and computing devices, networked using any medium and communication protocol.

Various aspects and functions in accordance with the present invention may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any storage device for storing data, such as a disk drive or other non-volatile storage device. Various embodiments in accordance with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI and InfiniBand. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable nonvolatile storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then copies the data to the medium associated with storage system 118 after processing is completed. A variety of components may manage data movement between the medium and integrated circuit memory element and the invention is not limited thereto. Further, the invention is not limited to a particular memory system or storage system.

Although computer system 102 is shown by way of example as one type of computer system upon which various aspects and functions in accordance with the present invention may be practiced, aspects of the invention are not limited to being implemented on the computer system as shown in FIG. 1. Various aspects and functions in accord with the present invention may be practiced on one or more computers having different architectures or components than that shown in FIG. 1. For instance, computer system 102 may include specially-programmed, special-purpose hardware, such as for example, an application-specific integrated circuit (ASIC) tailored to perform a particular operation disclosed herein, while another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and embodiments are not limited to any particular implementation.

The processor and operating system together define a computer platform for which application programs in high-level programming languages may be written. These component applications may be executable, intermediate, for example, C−, bytecode or interpreted code which communicates over a communication network, for example, the Internet, using a communication protocol, for example, TCP/IP. Similarly, aspects in accord with the present invention may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the present invention may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the invention is not limited to a specific programming language and any suitable programming language could also be used. Further, in at least one embodiment, the tool may be implemented using VBA Excel.

A computer system included within an embodiment may perform additional functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of Uppsala, Sweden or integration software such as Web Sphere middleware from IBM of Armonk, N.Y. However, a computer system running, for example, SQL Server may be able to support both aspects in accord with the present invention and databases for sundry applications not within the scope of the invention.

Example System Architecture

Figure 2:
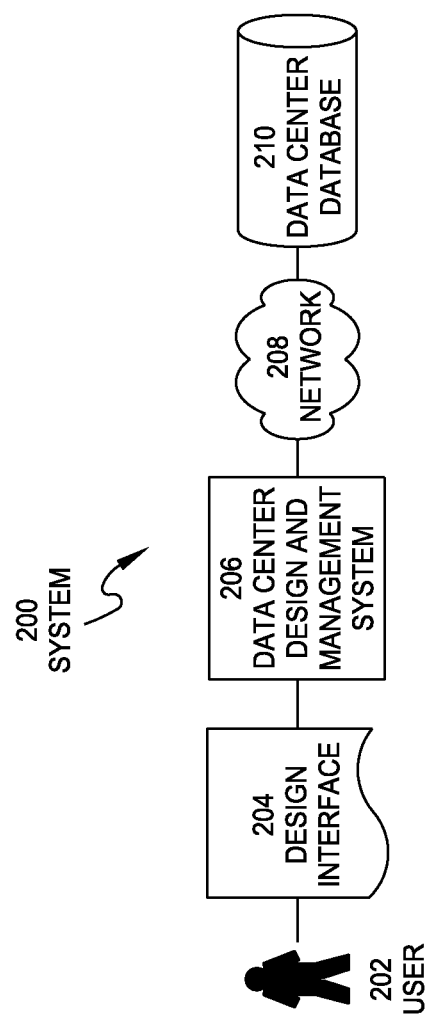
FIG. 2 illustrates an example distributed system including an embodiment.

FIG. 2 presents a context diagram including physical and logical elements of distributed system 200. As shown, distributed system 200 is specially configured in accordance with the present invention. The system structure and content recited with regard to FIG. 2 is for exemplary purposes only and is not intended to limit the invention to the specific structure shown in FIG. 2. As will be apparent to one of ordinary skill in the art, many variant system structures can be architected without deviating from the scope of the present invention. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the invention.

Referring to FIG. 2, system 200 includes user 202, interface 204, data center design and management system 206, communications network 208 and data center database 210. System 200 may allow user 202, such as a data center architect or other data center personnel, to interact with interface 204 to create or modify a model of one or more data center configurations. According to one embodiment, interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, interface 204 may be implemented with specialized facilities that enable user 202 to design, in a drag and drop fashion, a model that includes a representation of the physical layout of a data center or any subset thereof. This layout may include representations of data center structural components, including raised floor plenum characteristics, as well as data center equipment. The features of interface 204, as may be found in various embodiments in accordance with the present invention, are discussed further below. In at least one embodiment, information regarding a data center is entered into system 200 through the interface, and assessments and recommendations for the data center are provided to the user. Further, in at least one embodiment, optimization processes may be performed to optimize cooling performance and energy usage of the data center.

As shown in FIG. 2, data center design and management system 206 presents data design interface 204 to user 202. According to one embodiment, data center design and management system 206 may include the data center design and management system as disclosed in PCT/US08/63675. In this embodiment, design interface 204 may incorporate functionality of the input module, the display module and the builder module included in PCT/US08/63675 and may use the database module to store and retrieve data.

As illustrated, data center design and management system 206 may exchange information with data center database 210 via network 208. This information may include any information required to support the features and functions of data center design and management system 206. For example, in one embodiment, data center database 210 may include at least some portion of the data stored in the data center equipment database described in PCT/US08/63675. In another embodiment, this information may include any information required to support interface 204, such as, among other data, the physical layout of one or more data center model configurations, the production and distribution characteristics of the cooling providers included in the model configurations, the consumption characteristics of the cooling consumers in the model configurations, and a listing of equipment racks and cooling providers to be included in a cluster.

In one embodiment, data center database 210 may store types of cooling providers, the amount of cool air provided by each type of cooling provider, and a temperature of cool air provided by the cooling provider. Thus, for example, data center database 210 includes records of a particular type of CRAC unit that is rated to deliver airflow at the rate of 5,600 cfm at a temperature of 68 degrees Fahrenheit. In addition, the data center database 210 may store one or more cooling metrics, such as inlet and outlet temperatures of the CRACs and inlet and outlet temperatures of one or more equipment racks. The temperatures may be periodically measured and input into the system, or in other embodiments, the temperatures and airflows may be continuously monitored using devices coupled to the system 200. Further in some embodiments, for installed data centers, actual airflow measurements from one or more perforated tiles may be used by a system to improve accuracy of one of the processes described herein. Still further, the measured airflow may be used by a system in one embodiment as a check against calculated airflows, and when a difference between measured and calculated exceeds a preset threshold, a warning may be initiated to alert an operator of the system.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. Further, the system in FIG. 2 may also connect to one or more devices in a data center, including components of the cooling system or power distribution system to control and monitor these systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts. Thus, embodiments of the invention are not limited to a specific number of users or systems.

In at least one embodiment, which will now be described, a tool is provided that predicts in real-time the airflow through perforated tiles of an under-floor plenum in a data center. The tool utilizes novel methods of modeling the under-floor plenum in a data center and simplifying analysis of the models to predict real-time airflow performance. The ability to predict performance in real-time or near real-time allows the tool to be used to quickly analyze several possible solutions and consider various design trade-offs. As discussed further below, the tool can be used as a stand-alone trade-off tool, incorporated in a data center design system, or incorporated as part of a data center management system such as APC's InfrastruXure® Central and Operations Manager products discussed above.

In the following description, five novel, high-level methods are provided for estimating perforated tile airflow, and in addition, novel techniques for modeling plenums and simplifying calculations within the high-level methods are also provided. The five high-level methods are identified as the Flow Network Method (FNM), Pressure-Averaged Bernoulli Correction method (PAB-C), Potential Flow Method (PFM), Hybrid method and Fast Fluid Dynamics (FFD) method. Each of these methods may be incorporated in a tool which can be combined with existing data center design and management systems to provide improved performance.

Flow Network Model

The Flow Network Model (FNM) method is a fluid-flow prediction technique most often used to predict the pressure drop in duct and piping systems. The FNM is based on an assumption that the pressure drop experienced by a fluid moving through some resistive element (e.g. a length of pipe or a perforated tile) is related to the flow rate through the resistive element by some simple function such as shown in Equation (1).

$$\Delta P = R Q^2 \quad (1)$$

Where R is typically a known resistance in units of pressure drop per flow rate squared. In the FNM used in at least some embodiments described herein, airflow is driven purely by pressure differences ignoring momentum. Although the airflow paths are not known a priori in the plenum application, the FNM is adapted to work and then "tuned" empirically against a large number of CFD benchmark solutions.

Figure 3:
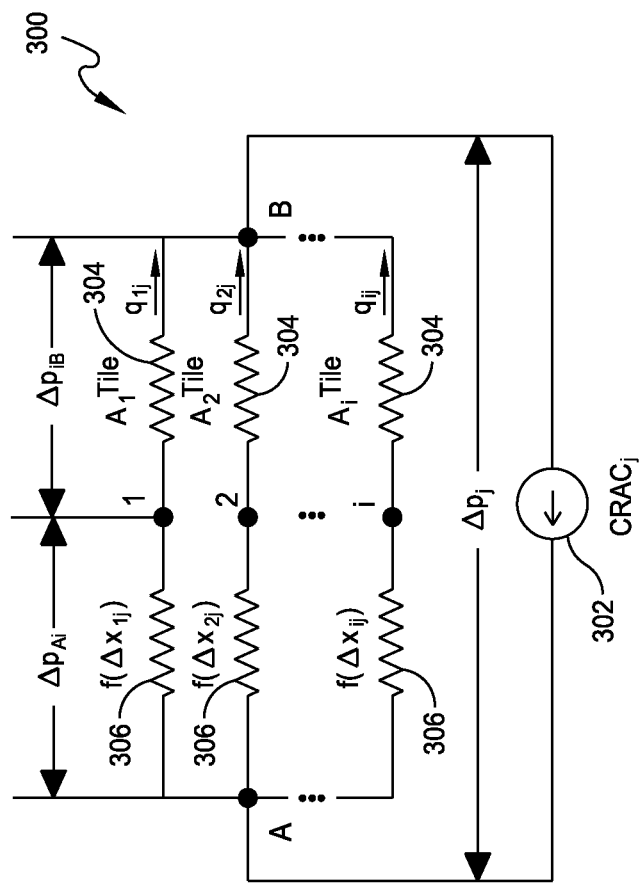
FIG. 3 shows an electrical circuit analog of airflow in a raised-floor data center.

FIG. 3 shows an electrical circuit analog 300 of airflow in a raised-floor data center. In the analog, the current source 302 represents one of j CRACS, the resistors 304 represent the resistance to airflow of each of i perforated floor tiles, and the resistors 306 represent the resistance of the flow path from the output of the CRAC j to each of the perforated tiles i. For any CRAC j, there is a separate path for the cold air it supplies to reach any individual perforated tile i. Point A is the location right below the CRAC's blowers inside the plenum and point B is the space above the perforated tiles in the data center room. It is assumed that the cold air supplied by CRAC j will separate at point A into N streams of airflow (N is the number of perforated tiles) and travel independently in the raised-floor plenum before reaching point i, which is the location right below each perforated tile i, and then leave the plenum through tiles and enter the room space. The airflow will then mix inside the data center room before it finds its way back to the CRAC j to complete the loop.

From FIG. 3, it can be seen that the pressure drop across the flow paths and through the perforated tiles has to be equal to the total pressure drop across the CRACs as shown in Equation (2).

$$\Delta p_j = \Delta p_{Ai} + \Delta p_{iB} \quad (2)$$

It can be assumed that the pressure drop $\Delta p_{Ai}$ is a function of airflow $Q_{ij}^2$ and that $f(\Delta x_{ij})$ is a function of the distance $\Delta x_{ij}$ as shown in Equation (3).

$$\Delta p_{Ai} = f(\Delta x_{ij}) Q_{ij}^2 \quad (3)$$

Where $f(\Delta x_{ij})$ is the flow resistance in the plenum between tile i and CRAC j;

$Q_{ij}$ is the airflow through perforated tile i supplied by CRAC j;

It is empirically observed that the plenum flow resistance $f(\Delta x_{ij})$ can be expressed as:

$$f(\Delta x_{ij}) = \Delta x_{ij}^{-C} \quad (4)$$

Where $\Delta x_{ij}$ is the distance between perforated tile i and CRAC j;

C is an empirically determined constant, which is a function of plenum depth and leakage.

The empirically-determined parameter C is selected to give the best overall agreement with CFD benchmark results over a large number of room configurations, CRAC flow rates, tile types, leakage factors, and plenum depths. The parameter C depends primarily on leakage factor and plenum depth, and in one embodiment, the values used for C are included in Table 1.

TABLE 1

Empirically-Determined Constant, C

| Leakage Factor | Plenum Depth (in) | | | | |
|---|---|---|---|---|---|
| | 12 | 18 | 24 | 36 | 48 |
| 0 | 5.89 | 6.37 | 6.83 | 7.51 | 8.28 |
| 0.1 | 5.76 | 6.23 | 6.62 | 7.19 | 7.86 |
| 0.2 | 5.63 | 6.10 | 6.44 | 6.87 | 7.52 |
| 0.3 | 5.50 | 5.97 | 6.29 | 6.64 | 6.98 |
| 0.4 | 5.37 | 5.85 | 6.15 | 6.49 | 6.64 |
| 0.5 | 5.22 | 5.75 | 5.99 | 6.35 | 6.47 |

The pressure drop characteristics of each perforated tile type are generally known from published data and can be written as $\Delta P_{iB} = A_i Q_{ij}^2$. Combining this with Equations 1-4, and for the airflow through each perforated tile results in Equation (5).

$$Q_{ij} = \sqrt{\frac{\Delta P_j}{\Delta x_{ij}^{-C} + A_i}} \quad (5)$$

Because of conservation of mass, the sum of the airflow through all of the tiles must be equal to the airflow from the CRAC (assuming no leakage) as expressed in Equation (6).

$$\sum_{i}^{All\ Tiles} Q_{ij} = Q_j^{CRAC}. \quad (6)$$

Where $Q_j^{CRAC}$ is the total airflow supplied by CRAC j. Combining Equations 5 and 6 yields Equation (7).

$$\Delta P_j = \left( \frac{Q_j^{CRAC}}{\sum_{i}^{All\ Tiles} \left[ \frac{1}{\sqrt{\Delta x_{ij}^{-C} + A_i}} \right]} \right)^2 \quad (7)$$

By substituting Equation 7 into Equation 5, $Q_{ij}$ can be expressed as shown in Equation (8)

$$Q_{ij} = \frac{Q_j^{CRAC}}{\sum_{i}^{All\ Tiles} \left[ \frac{1}{\sqrt{\Delta x_{ij}^{-C} + A_i}} \right]} \frac{1}{\sqrt{\Delta x_{ij}^{-C} + A_i}} \quad (8)$$

The airflow through each tile i can then be computed using Equation (9).

$$Q_i^{Tile} = \sum_{j}^{All\ CRACs} Q_{ij}. \quad (9)$$

Although leakage airflow is not explicitly considered in the FNM, the total CRAC airflow rate may be reduced to account for leakage, so that only the airflow that actually passes through tiles is considered in the calculation. In one embodiment, the amount of airflow reduction for each CRAC is taken in proportion to its total flow rate.

Figure 4:
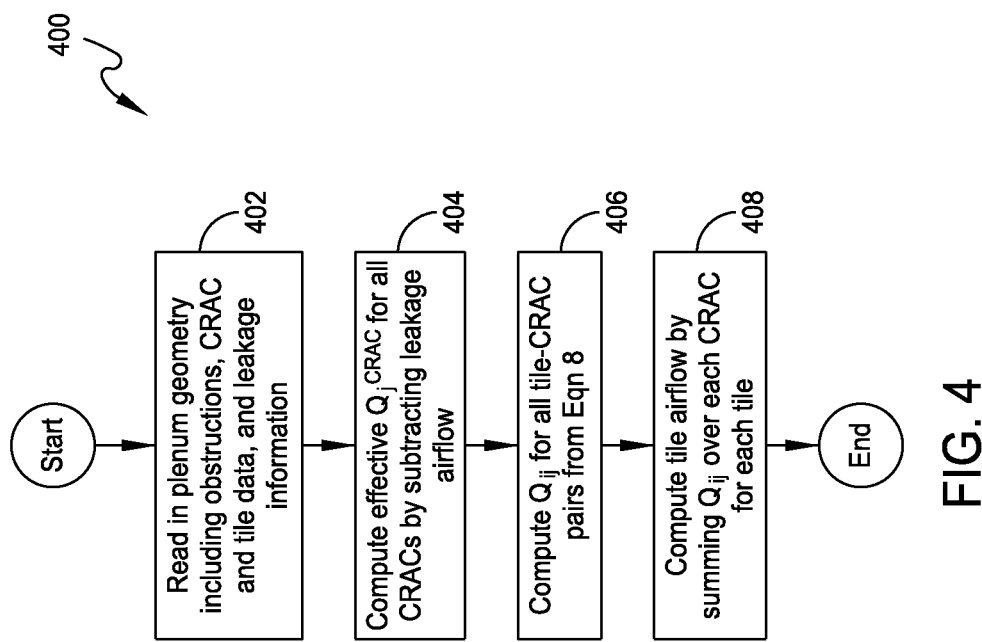
FIG. 4 shows a process for determining airflows in a plenum in accordance with one embodiment.

FIG. 4 provides a summary of a process 400 used in a data center management and/or design system for computing tile airflow using and FNM based process in accordance with one embodiment. In a first act 402 of the process, information related to the plenum including plenum geometry and CRAC and tile locations are entered into the system. In one embodiment, the information is entered by a user, while in at least one other embodiment, the information is accessed from information regarding the data center stored in the system. In one embodiment, a model of the data center may be displayed showing the raised floor with CRAC and perforated tile locations. In a second act 404, the effective airflow for each CRAC is determined by subtracting leakage airflow. At act 406, the airflow at each tile from each CRAC is determined using Equation (8) discussed above. Next, at act 408, the total airflow at each tile is determined by summing the airflows from each CRAC at each tile. The process then ends at act 410. In at least one embodiment, the results of the process 400 are used by the data center management and/or design system as one of the inputs to analyze the cooling performance of a data center.

The use of the Flow Network Model to compute perforated tile airflow was previously known, but typically limited by the assumption of uniform plenum pressure. This assumption results in all tiles of a given construction (e.g., 25% or 56% open area) delivering the same airflow rate. This is equivalent to simply estimating tile airflow based on the average plenum pressure. This approach can be very misleading as it predicts that tiles with the greatest open area will deliver the most airflow. In practice, the use of large-open-are tiles often leads to substantial airflow non-uniformities and even backflow (flow in the reverse direction from the room into the plenum.) The use of flow path resistance from CRACS to air tiles, as in some embodiments of the present invention, results in non-uniform plenum pressure predictions with different airflow rates for different tiles even if they are of the same construction, and provides a more accurate estimate of the airflow from tiles.

Pressure Averaged Bernoulli Correction Method (PAB-C)

PAB-C is a real-time technique used in at least some embodiments for predicting tile airflow. Using PAB-C the overall plenum airflow pattern is determined from a superposition of airflow patterns associated with each CRAC. These airflow patterns, in turn, are estimated from known formulae. Airflow patterns are computed from a weighted average of a two-dimensional jet and a purely hemi-cylindrical radial flow pattern from each CRAC. With the plenum airflow pattern known, the Bernoulli Equation along with a "pressure correction" technique is used to determine the final plenum pressure distribution. Next, the airflow rate through each tile is computed from known tile-airflow-vs.-pressure-drop data.

Figure 5:
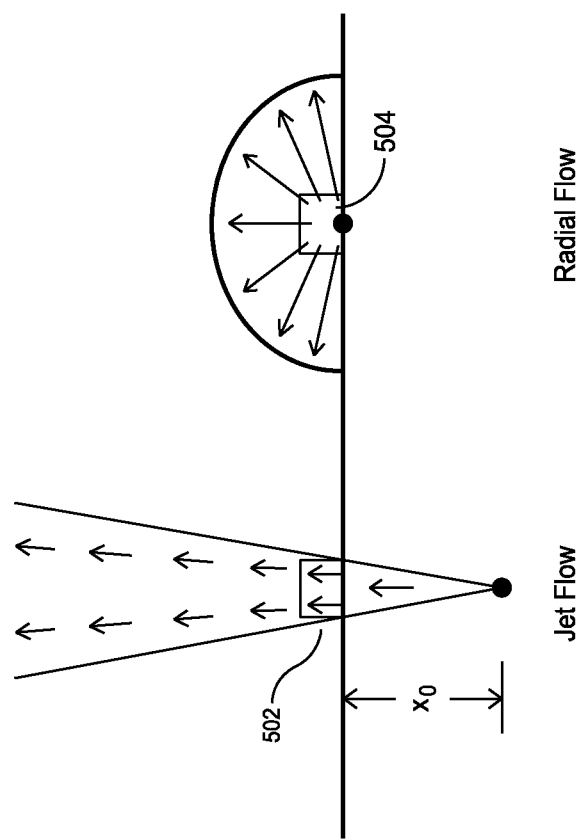
FIG. 5 shows representations of airflow from a CRAC.

While CRACs are occasionally installed with turning vanes which redirect the airflow parallel to the floor, usually (and preferably), CRAC airflow directly impacts the solid subfloor and then spreads out throughout the plenum. This is preferable because the airflow is distributed more uniformly at lower velocity with less variation in pressure. The bounding walls, placement of other CRACs and perforated tiles, may cause the flow to be directed more in a particular direction more like a traditional jet flow. Consequently, the airflow pattern near a CRAC can be approximated as some weighted average of jet and radial components as shown in Equation (10).

$$\vec{V} = (1-\theta)\vec{V}_{jet} + \theta \vec{V}_{radial} \quad (10)$$

Where $\vec{V}_{jet}$ and $\vec{V}_{radial}$ are the velocity vectors associated with the jet and radial airflow patterns respectively, and $\theta$ is an empirically-determined weighting parameter. FIG. 5 shows a representation of jet flow from a CRAC 502 and radial flow from a CRAC 504. The two-dimensional jet airflow pattern has been determined analytically (see, Bejan, A. Convection Heat Transfer, Wiley and Sons, New York, 1984), as shown in Equation (11).

$$u_{jet} = U_0 \left(\frac{x}{x_0}\right)^{-\frac{1}{2}} \left\{1 - \tanh^2\left(\gamma \frac{y}{x}\right)\right\} \quad (11)$$

Where $u_{jet}$ is the velocity component in the direction of the jet, $U_0$ is the velocity of the jet (and the supply velocity of the CRAC) at a distance $x_0$ from the fictitious jet origin point (taken at the back of the CRAC), y is the distance from the jet centerline perpendicular to the jet direction, and $\gamma = 7.67$, an experimentally-determined constant. The $v_{jet}$ velocity component in the y direction can be determined from Equation 11 and the Continuity Equation (conservation of mass). The result is shown in Equation (12).

$$v_{jet} = \frac{U_0}{2\gamma x} \left(\frac{x}{x_0}\right)^{-\frac{1}{2}} \left\{2\gamma y \operatorname{sech}^2\left(\gamma \frac{y}{x}\right) - x \tanh\left(\gamma \frac{y}{x}\right)\right\} \quad (12)$$

Finally, $x_0$ can be related to the CRAC width $D_0$ by $x_0 = 4\gamma D_0/3$.

The radial airflow pattern velocity magnitude is determined by the CRAC flow rate $Q_{CRAC}$ and radial distance r from the center-rear of the CRAC as shown in Equation (13).

$$V_{radial} = \frac{Q_{CRAC}}{\pi r d} \quad (13)$$

Where d is the plenum depth. Equation (13) would be modified if the CRAC is not placed against a wall; in this case, the resulting velocity pattern would be cylindrical rather than hemi-cylindrical.

Converting to Cartesian coordinates, the x and y velocity components are as shown in Equation (14)

$$u_{radial} = \frac{xQ_{CRAC}}{\pi d(x^2 + y^2)} \quad (14)$$

$$v_{radial} = \frac{yQ_{CRAC}}{\pi d(x^2 + y^2)}$$

With the airflow pattern associated with each CRAC known throughout the plenum, the overall airflow pattern is estimated using superposition; the u and v velocity components at each desired calculation point from each CRAC are summed. The result is that CRACs of equal strength blowing directly at one another will create a zero-velocity point midway between them.

Figure 6:
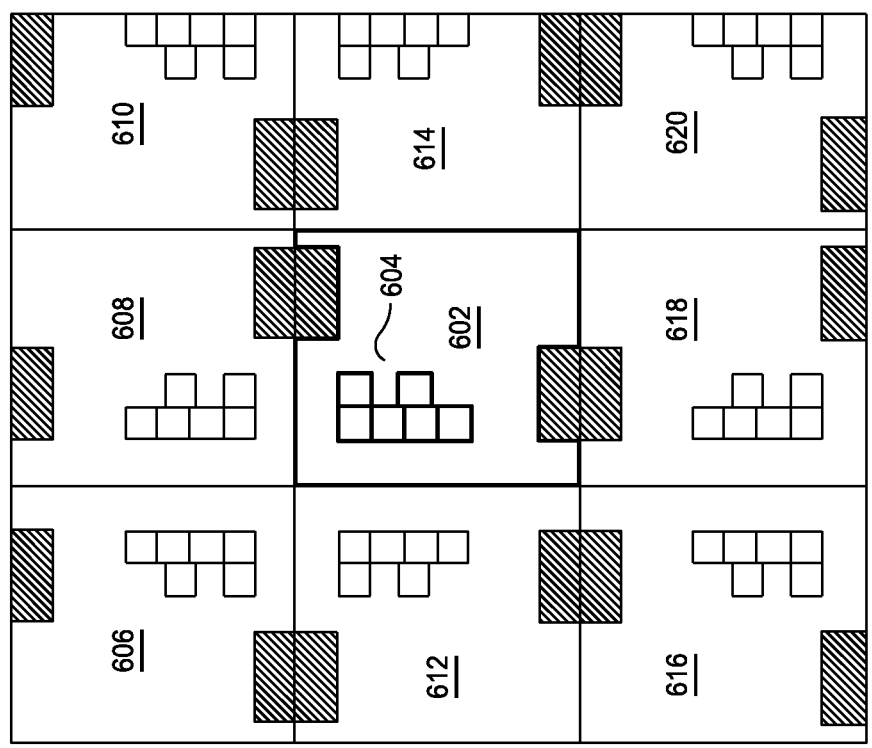
FIG. 6 demonstrates the use of symmetry in accordance with one embodiment.

In one embodiment, to model the plenum walls (boundaries), symmetry is exploited as will now be described with reference to FIG. 6. Using symmetry, for each plenum considered, eight additional, fictitious plenum areas are included in the analysis. FIG. 6 shows a plenum 602 that is to be analyzed. The plenum 602 has perforated tiles 604. Also shown in FIG. 6 are eight additional plenums 606, 608, 610, 612, 614, 616, 618, 620 that are added for symmetry with one plenum added to each side and one to each corner as shown in FIG. 6, and with each additional plenum having the same (mirror-symmetry) arrangement of CRACs and perforated tiles as the plenum 602 being analyzed. The additional plenums provide a velocity distribution which nearly cancels the velocity normal to the wall boundaries of the plenum of interest emulating the presence of the bounding walls. In other embodiments, to improve accuracy of the solution, rather than provide only one additional fictitious plenum to each side, the symmetry pattern may be repeated further outward in all directions.

Figure 7:
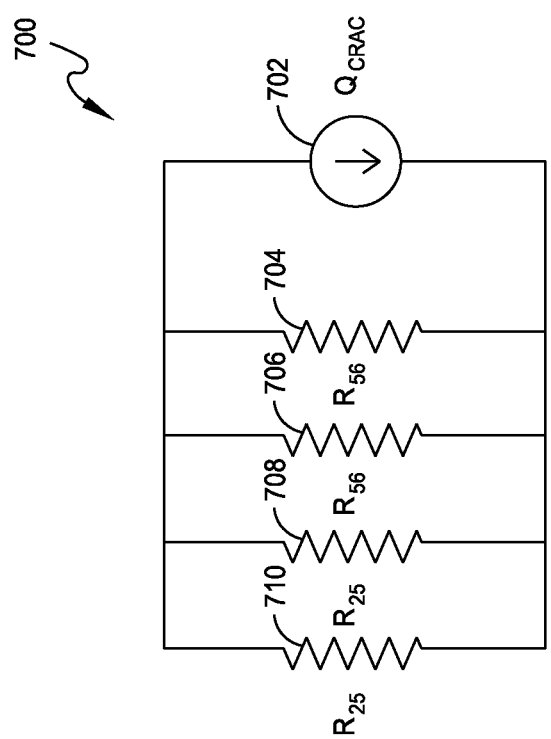
FIG. 7 shows an electrical circuit analog of airflow in a raised floor data center.

For this embodiment, the average plenum pressure is defined as the single uniform pressure that would exist in the plenum if the only resistance in the system was due purely to the perforated tiles. The average plenum pressure for the plenum 602 in FIG. 6 can be determined using the electric-circuit analogy 700 shown in FIG. 7. In FIG. 7, all CRAC airflow is lumped together into a single current source 702 and four resistances 704, 706, 708 and 710 are shown which represent four perforated tiles, two 25%-open tiles and two 56%-open tiles. Although this can be generalized to any number and type of tiles, for $n_{25}$ 25%-open tiles and $n_{56}$ 56%-open tiles, the average plenum pressure is as shown in Equation (15).

$$P_{ave} = \frac{(1-f)^2 Q_{CRAC}^2}{\left(\frac{n_{25}}{\sqrt{a_{25}}} + \frac{n_{26}}{\sqrt{a_{56}}}\right)^2} \quad (15)$$

Where the perforated-tile pressure-drop-vs.-airflow characteristics can be modeled as $\Delta P=aQ^2$ where "a" is a different, known, constant for each tile type and f is the leakage factor. The leakage factor is defined as the fraction of total CRAC airflow which exits the plenum without passing through perforated tiles.

The actual pressure at any given point in the plenum is typically not equal to the average pressure. The pressure at any point can be determined using the Bernoulli equation as shown in Equation (16):

$$P_i + \frac{1}{2}\rho V_i^2 = \text{constant} \quad (16)$$

Where $V_i$ is the magnitude of the velocity (speed) of the airflow at point i. According to Equation 16, if the pressure at one point in the plenum is known, then the pressure at all points can be determined. However, initially, the absolute pressure at any given point is not known, but as will now be described, the pressure at one point can be determined. The correct absolute (thermodynamic) pressure $P_i$ can be decomposed into two parts as shown in Equation (17).

$$P_i = P_i^{-*} + P' \quad (17)$$

Where $P_i^*$ is the relative pressure computed from Equation (16) and P' is the constant pressure correction that must be added to all $P_i^*$s to obtain the desired absolute pressure. A reference point, e.g. the coordinate origin, is taken to have $P_i^*(0,0) = P_1^* = 0$ and all other $P_i^*$s are computed relative to this value. The correct P' is the one that results in an overall mass balance between CRAC airflow and tile airflow plus leakage as shown in Equation (18)

$$(1-f)Q_{CRAC} = \sum_{i=1}^{n} Q_i^{tile} \quad (18)$$

Where n is the number of perforated tiles. $P_i$ is then found numerically by adjusting P' until Equation (18) is satisfied. In other embodiments, other algorithm's can be employed, and in one embodiment, a simple bisection method is used in which the overall mass balance is checked based on guesses for P'; subsequent guesses are made halfway between the two previous best guesses until P' changes by no more than a negligible amount. The search space for P' is based on physical scales of the problem, e.g., from $-3P_{ave}$ to $3P_{ave}$.

$Q_i^{tile}$ in Equation 18 is computed in one embodiment using Equation (19).

$$Q_i^{tile} = \frac{P_i}{|P_i|} \sqrt{\frac{|P_i|}{a_i}} \quad (19)$$

Where, as discussed above, $a_i$ is a known flow-resistance characteristic of the tile and the form of the equation allows the tile airflow to be positive (out of the plenum) or negative (into the plenum) depending on the sign of $P_i$.

In another embodiment, an alternative to the pressure-correction technique is used to model the airflow-pressure coupling. In the "airflow-correction" technique, physically-correct pressures, i.e. those that satisfy the mass balance of Equation (18), are not explicitly determined. Instead, pressures at every point are determined relative to $P_{ave}$ of Equation (15) using Equation (16): $P_i = P_{ave} - \frac{1}{2}\rho V_i^2$. The pressures are then used to determine tile flow rates using Equation (19). Instead of correcting the pressure values at this point, in the airflow-correction technique, predicted tile airflow rates are simply corrected up or down uniformly over all tiles as needed to satisfy the mass balance of Equation (18). The airflow-correction technique adds additional approximations to the coupled potential-flow-Bernoulli-Equation model which may reduce accuracy; however, it significantly increases solution speed and stability.

There is only one empirically-determined parameter in the PAB-C method, θ, which is selected to give the best overall agreement with CFD benchmark results over a large number of room configurations, CRAC size and flow rates, tile types, leakage factors, and plenum depths. The parameter θ depends primarily on leakage factor and plenum depth as summarized in Table 3. The CRAC airflow patterns are more radial with deeper plenums and lower leakages and are more jet-like with shallower plenums and higher leakages.

TABLE 3

Empirically-Determined Constant, θ

| Leakage Factor | Plenum Depth (in) | | | | |
|---|---|---|---|---|---|
| | 12 | 18 | 24 | 36 | 48 |
| 0 | 0.86 | 0.90 | 0.97 | 1.00 | 1.00 |
| 0.1 | 0.83 | 0.89 | 0.95 | 1.00 | 1.00 |
| 0.2 | 0.80 | 0.88 | 0.92 | 1.00 | 1.00 |
| 0.3 | 0.79 | 0.84 | 0.89 | 0.99 | 1.00 |
| 0.4 | 0.78 | 0.83 | 0.87 | 0.95 | 1.00 |
| 0.5 | 0.74 | 0.81 | 0.86 | 0.91 | 0.98 |

Note:
θ = 0: Jet
θ = 1: Radial

Figure 8:
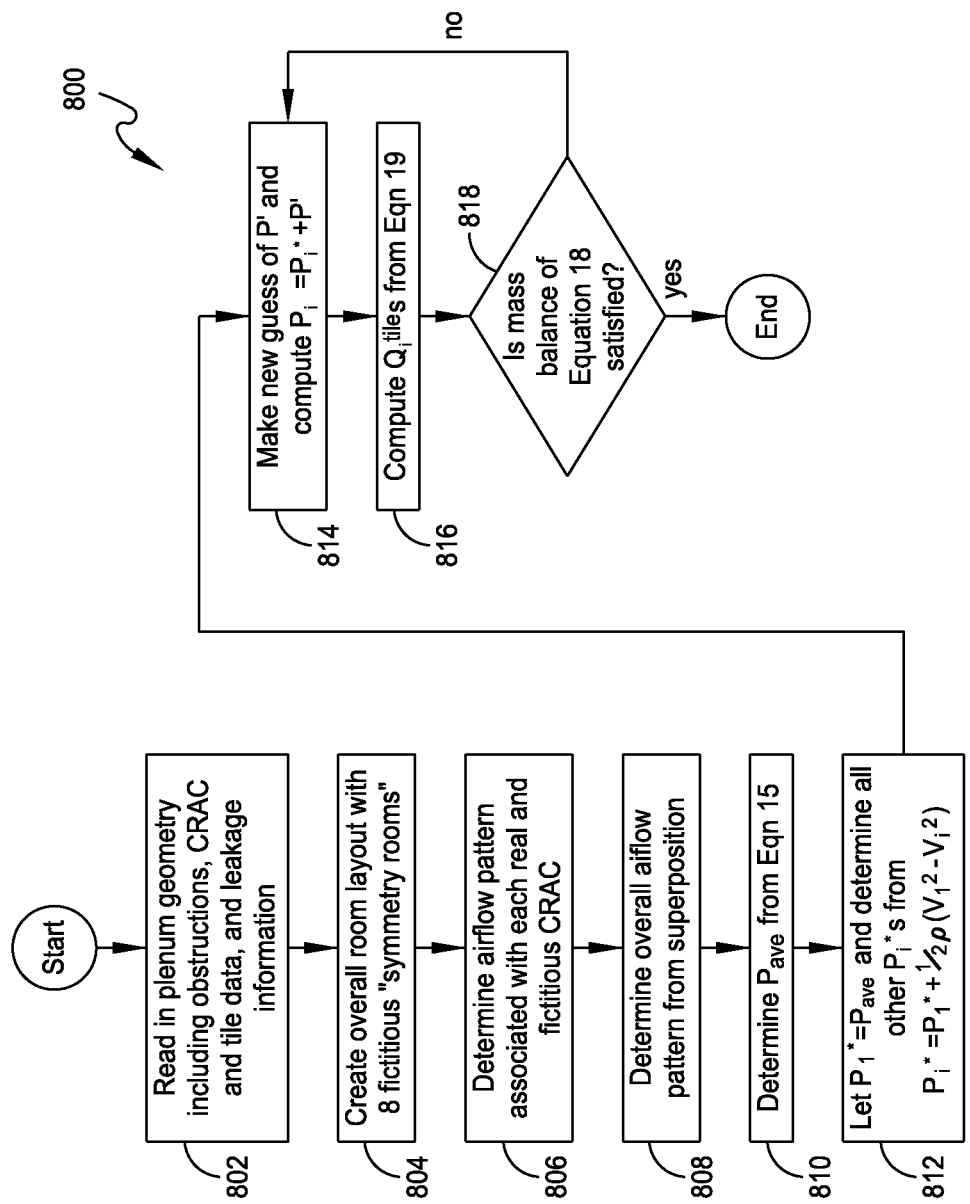
FIG. 8 shows a process for determining airflows in a plenum in accordance with one embodiment.

A process 800 in accordance with one embodiment for using the PAB-C method discussed above to determine airflow in a raised floor plenum will now be described with reference to FIG. 8. In a first act 802 of the process 800, information is read into a system configured to perform the process 800. The system may be one of the computer systems described above. The information may be read into the system from a storage media, transferred in to the system over a network, and/or entered into the system by a user. In a second act 804, the system creates an overall room layout using eight fictitious symmetry rooms as described above. Next, at act 806, the airflow pattern under the raised floor is determined for each actual CRAC and for each CRAC added for symmetry purposes. At act 808, the overall airflow is determined using superposition of the airflows from each individual CRAC. The average plenum pressure $P_{ave}$ is P is determined next at act 810 using Equation (15). At act 812, a first relative pressure $P_1^*$ is set equal to $P_{ave}$ and all other relative pressure values are then determined. At act 814, a first estimated values is set for the constant pressure correction value P' of zero, and each value of absolute pressure $P_i$ is also determined. At act

816, the airflow for each perforated tile is determined using Equation (19), and at decision block 818, a determination is made as to whether the mass balance of Equation (18) is satisfied within a predefined threshold. In one embodiment the mass balance of Equation (18) is within the threshold if the absolute difference between the left side and right side of Equation (18) is less than 0.5% of the average tile airflow. If the outcome of block 818 is YES, then the airflow values determined at act 816 are the final airflow values and the process 800 ends. If the outcome of decision block 818 is NO, then the process returns to act 814 where a new value of P' is used. Acts 814 to 818 repeat until the outcome of block 818 is YES, at which time, the final airflow values for each perforated tile have been determined.

Potential Flow Method (PFM)

The Potential Flow Method is a physics-based technique used in one embodiment to compute the plenum airflow pattern from first principles without a need for empirical "tuning" of the model against benchmark CFD cases and the potential flow method naturally handles plenum wall boundaries without additional steps or approximations. Using this method, computations are intensive and may be slower than other methods described herein (perhaps a few seconds to a minute with typical computing hardware and typical layouts) and there is no guarantee of how quickly or even if a "converged" solution will be found. In at least one embodiment, plenum airflow calculations are two dimensional; however, in other embodiments, three dimensional simulations are used. 3-D analyses provide a slight improvement in accuracy at the cost of solution speed.

For airflow which can be modeled as incompressible and irrotational, the airflow pattern may be determined from Poisson's Equation as shown in Equation (20).

$$\nabla^2 \phi = S''' \quad (20)$$

Where $S'''$ is a volumetric-flow-rate source per unit volume and $\phi$ is the velocity potential, related to the x and y-velocity components is as shown in Equation (21).

$$u = \frac{\partial \varphi}{\partial x} \quad (21)$$
$$v = \frac{\partial \varphi}{\partial y}$$

In the absence of a source term, Equation 20 reduces to Laplace's Equation, $\nabla^2 \phi = 0$. The "incompressible" assumption is rigorously applicable to plenum airflow; however, the "irrotational" assumption is strictly an approximation. From a calculation standpoint, in one embodiment, this assumption reduces the governing equations from 3 (1 mass conservation and 2 momentum conservation) equations and 3 unknowns (u, v, and P) to 1 equation for 1 unknown. As walls and jet flows provide a mechanism by which the real airflow pattern can become rotational, Equation 20 is not strictly applicable in these areas; however, the effect of friction along the walls is of minor significance in determining plenum airflow; the potential flow method correctly predicts that flow cannot penetrate a wall but in at least some embodiments does not model the frictional effects along the wall. Furthermore, as mentioned above, for CRACs without a turning vane, airflow impinges directly on the data center subfloor and then spreads out more-or-less equally in all directions; this type of airflow pattern is consistent with potential flow in which sources tend to "push" or "pull" airflow uniformly in all directions.

Figure 9:
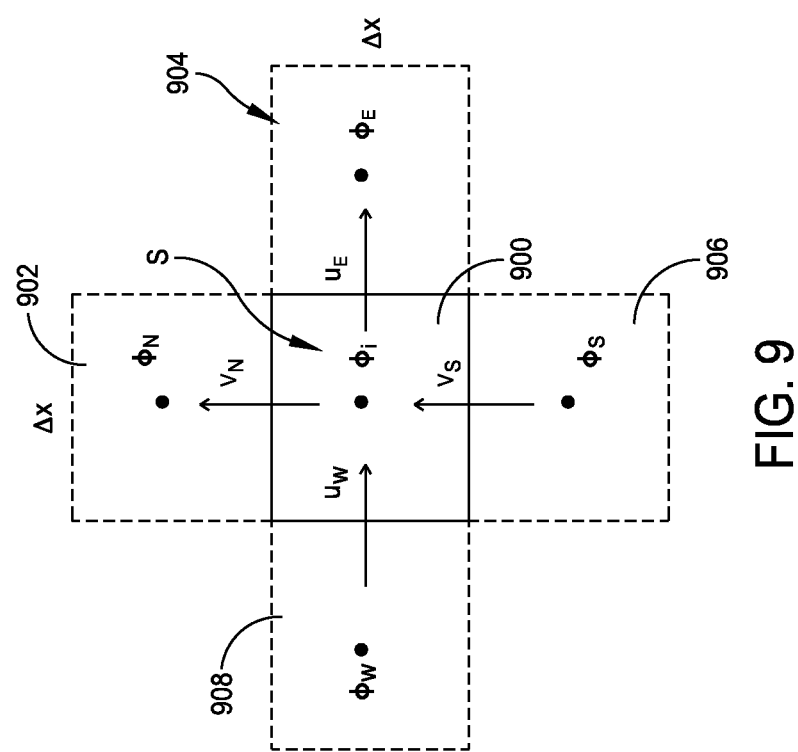
FIG. 9 demonstrates the use of grid cells in accordance with one embodiment.

Equation (20) appears simple; however, the complex boundary conditions for a real plenum application make analytical solutions of Equation (20) either impossible or very difficult and not very general. In one embodiment, which will now be described, a numerical solution of the problem uses a Finite Difference method. Following this method, the physical problem space to be analyzed is divided into a number of grid cells of size Δx by Δx by d. One finite difference equation is then constructed for each grid cell creating a set of n equations for n unknowns where n is the number of grid cells. FIG. 9 shows a 2-D grid cell 900 with neighboring grid cells 902, 904, 906 and 908. Airflow may enter or exit each side of the grid cell; additional airflow may be added to or subtracted from the grid cell by the source term S''' which may represent airflow from a CRAC, a perforated tile, leakage airflow or some combination of leakage plus tile or CRAC airflow. The net volumetric flow rate (e.g. in cfm) entering each grid cell must equal that exiting the grid cell as shown in Equations (22) and (23).

$$\Delta x d\left(\frac{\varphi_i - \varphi_w}{\Delta x}\right) + \Delta x d\left(\frac{\varphi_i - \varphi_S}{\Delta x}\right) + S''' = \quad (22)$$
$$\Delta x d\left(\frac{\varphi_E - \varphi_i}{\Delta x}\right) + \Delta x d\left(\frac{\varphi_N - \varphi_i}{\Delta x}\right) \text{ or,}$$

$$\varphi_i = \frac{1}{4}\left(\varphi_N + \varphi_S + \varphi_E + \varphi_W - \frac{S'''}{d}\right) \quad (23)$$

The form of Equation 23 changes somewhat for grid cells located against a solid wall or in a corner; adjacent solid cells do not contribute velocity potentials to the equation and, in a 3-D analysis, CRAC and tile airflows in the vertical direction may be explicitly included. The set of n equations and n unknowns is typically solved iteratively using a standard technique such as the Gauss-Siedel method as described in *Advanced Engineering Mathematics*, by E. Kreyszig Seventh Edition. 1993. John Wiley & Sons, New York. p. 986. In this method, the unknown associated with each grid cell is written explicitly on the left-hand side of the equation as in Equation 23. An initial guess is made for all $\phi_i$'s and then the guesses are improved by considering each equation in turn, marching through all grid cells. For each equation, the most-recently computed values of all $\phi_i$'s are always used. The solver keeps sweeping through all equations until the $\phi_i$'s no longer change or a fixed iteration limit has been reached.

Once the velocity potential field is determined, velocities are computed using Equation 21 re-written as a finite-difference approximation as Equation (24).

$$u_{\left(i+\frac{1}{2},j\right)} = \frac{\varphi_{(i+1,j)} - \varphi_{(i,j)}}{\Delta x} \quad (24)$$
$$v_{\left(i,j+\frac{1}{2}\right)} = \frac{\varphi_{(i,j+1)} - \varphi_{(i,j)}}{\Delta x}$$

Where i and j denote grid location in the x and y-directions respectively and the "½" signifies the cell face Δx/2 away from the cell center in the positive direction.

Figure 10:
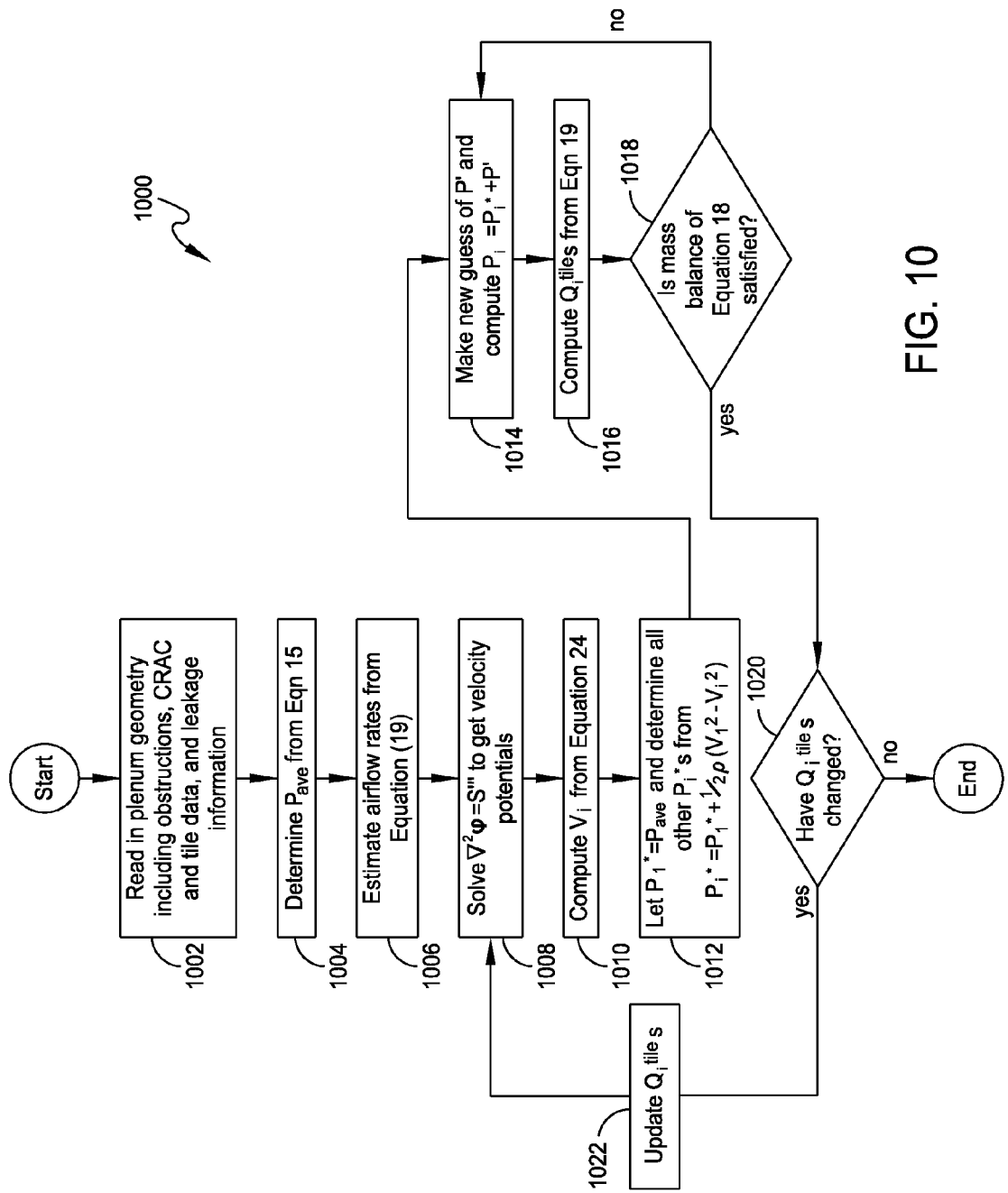
FIG. 10 shows a process for determining airflows in a plenum in accordance with one embodiment.

As with the PAB-C method described above, the plenum pressure distribution is determined in the pressure flow method in one embodiment using a "pressure correction" technique where the corrector pressure p' is varied until a mass balance between CRAC airflow and tile airflow and leakage airflow is achieved. In another embodiment, the "airflow correction" technique is used, also as described in the context of the PAB-C method. Unlike the PAB-C method, in at least one embodiment, the PFM continues iteratively with updated predictions of the potential, and thus velocity field. This process is used because, the PFM begins with a guess for the tile airflow rates, and the guess is changed when new tile airflow rates are computed based on the computed pressure field. The solution continues until the tile airflow is consistent with the predicted pressure field. Each new solution to the velocity field represents one "outer" iteration. "Inner" iterations are one pass through all grid cells while solving for φ. The entire solution process 1000 is summarized in FIG. 10.

In a first act 1002 of the process 1000, information is read into a system configured to perform the process 1000. The system may be one of the computer systems described above. The information may be read into the system from a storage media, transferred in to the system over a network, and/or entered into the system by a user. In a second act 1004 of the process 1000, the average pressure $P_{ave}$ is determined using Equation (15) as described above. Next, at act 1006, the airflow through each tile is estimated from Equation (19) where $P_i = P_{ave}$. Next, at act 1008, velocity potentials are determined, and then at act 1010, velocities are determined using Equation (24). Acts 1012, 1014, 1016 and 1018, are the same as acts 812 to 818 of process 800 described above. Once decision block 1018 is satisfied, the process determines at decision block 1020 whether the maximum tile airflow change is less than a threshold of 0.01% of average tile airflow. If the outcome of decision block 1020 is NO, then the process ends, and the tile airflow values are those most recently determined at act 1016. If the outcome of decision block 1022 is YES, then the process proceeds to act 1022 where the airflow for each tile is updated. Once the airflows are updated at act 1022, then acts 1008 through 1020 are repeated until the outcome of block 1020 is NO, then the last airflow values are set as the final airflow values for the perforated tiles. If acceptable convergence is not achieved after a specified number of iterations a warning message may be presented to the user. This message may also include an indication of the quality of the convergence in terms of a residual error based on the degree to which the mass balance of Equation (18) is satisfied.

When using the PFM to solve for tile airflow, the most computationally costly process is solving for velocity potentials. A fixed 6" grid within a 20 ft by 40 ft plenum would result in 3,200 grid cells. To solve for the velocity potentials for this example, several hundred inner iterations may be required. Additionally, several hundred outer iterations, in which tile boundary conditions are updated, may be required. In total, several hundred-thousand or million calculations can be performed to solve for converged tile airflows. In some embodiments, to remove some of the computational overhead, a larger fixed grid is used, but at the cost of accuracy and flexibility in defining smaller geometric features. In one embodiment which will now be described, a variable grid is used and its use combines the accuracy of small grid cells with the speed of large grid cells to greatly improve the efficiency of the algorithm. In one embodiment using a variable grid, to ensure accuracy, grid cells associated with CRACs and perforated tiles are made smaller while larger grid cells are placed in remaining areas. Though other cell sizes could be used, square cells of side-length 6, 12, and 24 inches are used in one embodiment.

Figure 11:
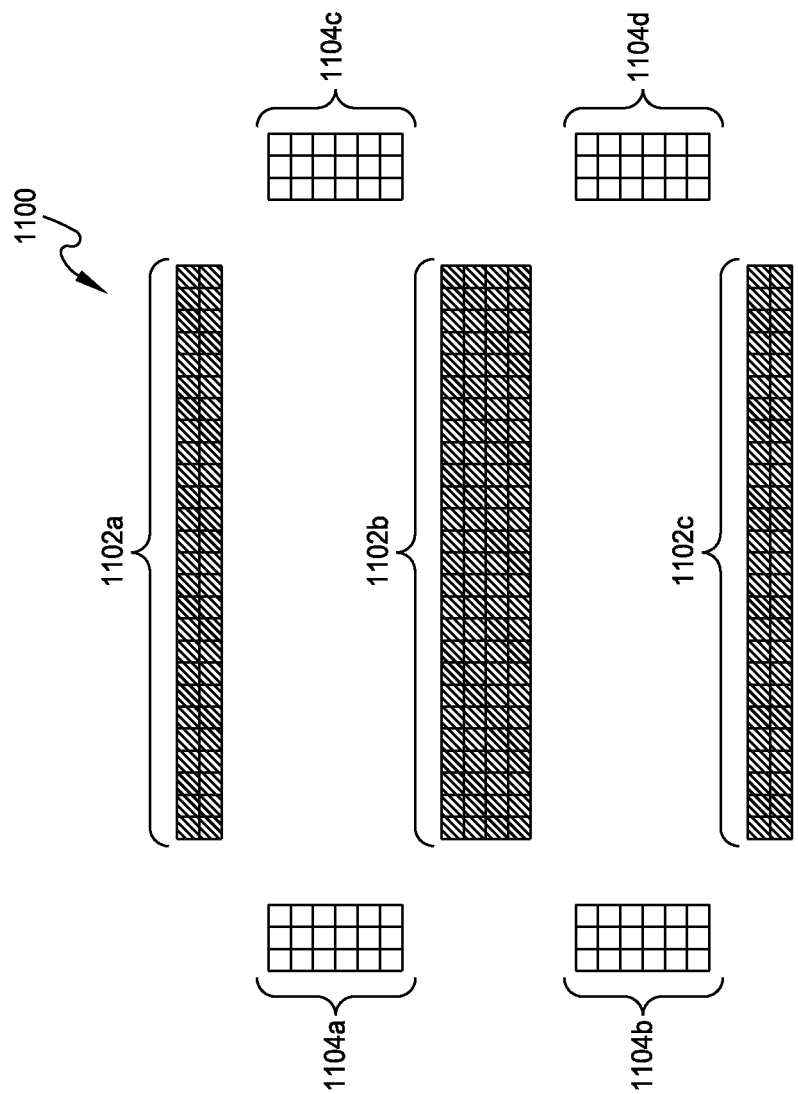
FIG. 11 demonstrates the use of variable size grid cells in accordance with one embodiment.

FIG. 11 shows an example of a 2-D variable grid 1100 used to analyze a perforated tile raised floor in accordance with one embodiment. In the 2D variable grid 1100, areas 1102(*a*), 1102(*b*) and 1102(*c*) represent areas containing perforated tiles and areas 1104(*a*), 1104(*b*), 1104(*c*) and 1104(*d*) represent CRACs. For the example in FIG. 11, the areas associated with the perforated tiles and CRACs have a smaller twelve inch grid, while other areas have a larger twenty-four inch grid. The number of grid cells contained in the 2D variable grid 1100 is 572 compared to 4,256 for the same raised floor modeled entirely using a fixed 6" grid. In at least one embodiment, in a computer system implemented to perform a plenum airflow analysis, once air plenum and CRAC parameters are entered into the system, the system will automatically establish a variable grid using a smaller grid in areas that have perforated tiles, CRACs, and as described below, in areas having obstructions. Accordingly, the analysis involved in analyzing the variable grid model is greatly simplified.

The finite difference equations for velocity potential and other variables are similar for fixed and variable grids. However, with a variable grid, there may be one-to-many in addition to one-to-one cell-face relationships. Further, with variable cell sizes in the same model, the node-to-node spacing (Δx in FIG. 9) is also variable and Equation (23) is altered accordingly.

As previously described, solving for the velocity potentials is the most computationally costly portion of solving for the tile airflow. In at least one embodiment the speed and reliability of this part of the solution is improved by adding a relaxation factor, ω, such that new values of velocity potential are computed using Equation (25).

$$\phi_i = (1-\omega)\phi_i^{old} + \omega\phi_i^{new} \quad (25)$$

Where $\phi_i$ is the final, adjusted value to be used to begin the next iteration, $\phi_i^{old}$ is the value from the previous iteration and $\phi_i^{new}$ is the value just calculated before adjustment. Thus, ω=1 is no relaxation, ω<1 is under relaxation, and ω>1 is over relaxation. The concept of a relaxation factor is common in CFD and other numerical analyses; in the present application, which features fairly stable solutions, over-relaxation can often be used to speed-up solutions by perhaps a factor of 10 and, in many cases, ω can be set as large as 1.8. However, in some cases, as when large-open-area tiles are used, under-relaxation is used to ensure reliable convergence. In such examples, the velocity through the tiles can exceed that of CRACs. Without under-relaxation (or damping), such high localized velocities can cause the solution to become unstable. Although, the relaxation factor was just discussed in the context of inner iterations (the solution of velocity potentials), the same concept is applied in some embodiments to outer iterations wherein an equation analogous to Equation (25) is used to set the tile airflow rates.

As discussed above, the PFM solution process includes a series of inner and outer iterations. In typical examples, many inner iterations are performed for each outer iteration, and since inner iterations are the most computationally expensive portion of the solution in one embodiment, the number of inner iterations performed is minimized while ensuring that the final results are fully converged. In this embodiment, it is recognized that during the earlier outer iterations, excessive inner iterations are unnecessary and wasted as the tile airflow rates will be changed significantly at the next outer iteration anyway and will then no longer be compatible with the computed velocity potential field. After many outer iterations, tile airflow rates change much less from outer-iteration to outer-iteration and more inner iterations are justified and required to achieve accuracy. Through empirical testing, it is found that linearly increasing the number of inner iterations with every outer iteration provides consistently well-converged results while minimizing the total number of inner iterations. It is also observed that the improved number of starting inner iterations and the rate of increase depend primarily on the size of the room, the perforated tile type(s) and quantity, as well as the number of CRACs. Larger rooms with more open tiles generally require more inner iterations.

Figure 12:
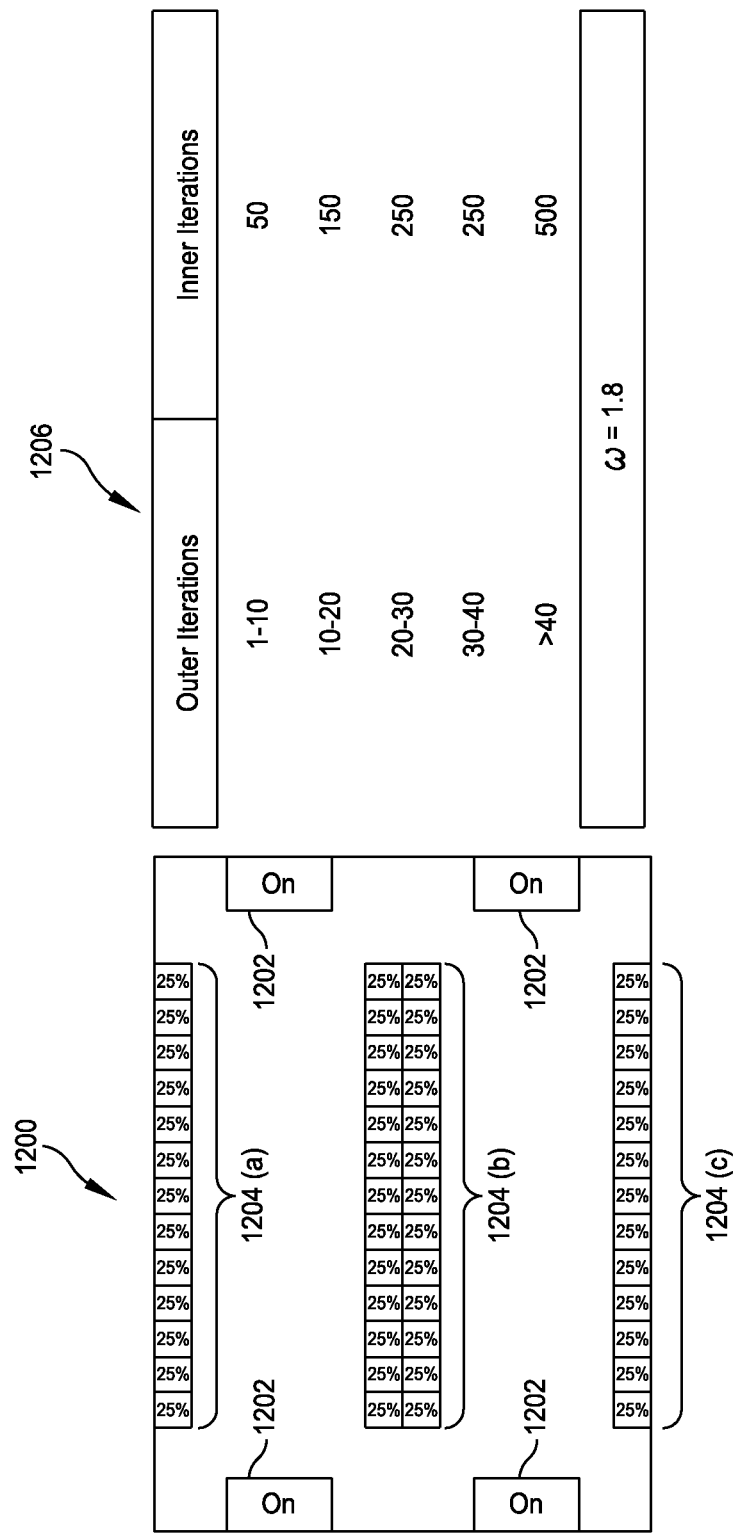
FIG. 12 is an illustration showing an example of a process used to reduce computation time in accordance with one embodiment.

One example of improved solution-control parameters for a specific layout will now be described with reference to FIG. 12, which shows a raised floor cooling design 1200 having four CRACs 1202 and three areas 1204(a), 1204(b) and 1204(c) containing perforated tiles. In the example, each of the CRACs deliver airflow of 10,000 cfm each, all perforated tiles are 25%-open-area tiles, and the plenum is 1 ft deep. For the given example, the table 1206 adjacent to the layout in FIG. 12 shows improved solution parameters for the number of inner iterations to be run depending on the number of outer iterations that have been run. Note that the values would change if, for example, tile types were modified or even if a CRAC were deactivated.

The approach discussed above, including the variable grid, is extended in at least one embodiment to provide a full three-dimensional analysis of the plenum. In this embodiment, along with the full 3-D representation of the plenum, blockages (such as CRAC piping and cable trays) in the plenum are also included in the analysis. However, this approach may increase solution time substantially. To maintain the speed and simplicity of the 2-D technique, while accounting for blockages, in one embodiment, a "staggered checkerboard" technique is employed. With this approach a solid blockage, which occupies only a portion of the plenum depth, is modeled as part solid and part air space with the fraction of air space equal to the fraction of unobstructed plenum depth.

The staggered checkerboard approach will be explained further with reference to an example shown in FIGS. 13A, 13B and 13C. FIG. 13A shows a top view of a portion of a data center plenum 1300 having a blockage 1302 contained therein. FIG. 13B shows a side view of the plenum 1300 and the blockage 1302. The blockage 1302 does not fully block the plenum depth as shown in FIG. 13B. FIG. 13C shows the plenum 1300 with the blockage 1302 modeled as a staggered checkerboard 1304 to effectively represent the 3-D object in a 2-D representation. The 2-D model of the blockage features an alternating pattern of open (air) and solid spaces. Note that the pattern is staggered such that the air "sees" approximately the same fraction of open area from all directions. In the model of the blockage, the fraction of open air space to solid in the horizontal direction is equal to the fraction of unobstructed plenum depth to obstructed plenum depth. In embodiments of the invention, the 2-D modeling technique may be effectively used in combination with the variable grid discussed above, with the variable grid locally refined as necessary to provide sufficient granularity with which the proper ratio of solid to air space can be specified. The explicit "staggered checkerboard" flow or only the averaged velocity may be displayed to the user.

Fast Fluid Dynamics

In another embodiment, a Fast Fluid Dynamics (FFD) technique is used to determine airflow from perforated floor tiles in a data center. The Fast Fluid Dynamics (FFD) technique is generally known for solving the time-dependent continuity and the Navier-Stokes equations. See, "Stable fluids", Proceedings of 26th International conference on Computer Graphics and Interactive Techniques (SIGGRAPH'99), J. Stam Los Angeles, 1999, pp. 121-128. In addition, the FFD technique is used in the game and movie industry to provide a transient flow field prediction. In one embodiment that will now be described, an NFD based method is used to predict the cooling airflow supplied through perforated tiles in raised-floor data centers. In this embodiment, as will now be described, the FFD method is adapted to continuously solve the flow field in the plenum and compute the perforated tile airflow for each time step until the flow field reaches steady-state.

The incompressible Navier-Stokes equation may be written as shown in Equation (26).

$$\frac{\partial \vec{u}}{\partial t} = -\frac{1}{\rho}\nabla p - (\vec{u}\cdot\vec{\nabla})\vec{u} + v\nabla^2\vec{u} \quad (26)$$

Where
$\vec{u}$ is the velocity vector
t is the time
$\rho$ is the density
p is the pressure
$v$ is the kinematic viscosity
With a first order approximation for the transient term $$\frac{\partial \vec{u}}{\partial t},$$

Equation (24) can be expressed as shown in Equation (27).

$$\frac{\vec{u^{n+1}} - \vec{u^n}}{\Delta t} = -\frac{1}{\rho}\nabla p - (\vec{u}\cdot\vec{\nabla})\vec{u} + v\nabla^2\vec{u} \quad (27)$$

It is known to use a projection method to solve time-dependent incompressible fluid-flow problems based on the Helmholtz decomposition which consists of two steps. See, Chorin, A. J., 1967, "A numerical method for solving incompressible viscous flow problems", Journal of Computational Physics, 2, 12-26.

In the first step, an intermediate velocity $\vec{u}$ is computed ignoring the pressure gradient term $$-\frac{1}{\rho}\nabla p:$$

$$\frac{\vec{u} - \vec{u^n}}{\Delta t} = -(u'\cdot\vec{\nabla})u' + v\nabla^2\vec{u} \quad (28)$$

Where
$\vec{u}$ is the intermediate velocity
$\vec{u^n}$ is the velocity at the nth time step
$\Delta t$ is the time step size A time-splitting method can be used to solve for Equation 28 as described in Stam, J., 2003, "Real-Time Fluid Dynamics for Games", Proceedings of the Game Developer Conference and Zuo, W., 2010, "Advanced Simulations of Air Distributions in Buildings", Ph.D. Dissertation, Purdue University, West Lafayette, Ind. Using this method, a complex equation is broken into several small equations, the equations are solved separately, and the solutions are integrated to yield the final solution for the original equation.

Equation (28) can be divided into Equations (29) for diffusion and (30) for advection.

$$\frac{\overrightarrow{u^{(1)}} - \overrightarrow{u^n}}{\Delta t} = v\nabla^2 \vec{u} \tag{29}$$

And $$\frac{\overrightarrow{u^{(2)}} - \overrightarrow{u^{(1)}}}{\Delta t} = -(\vec{u} \cdot \vec{\nabla})\vec{u} \tag{30}$$

Where $\overrightarrow{u^{(1)}}$ is the intermediate velocity after diffusion $\overrightarrow{u^{(2)}}$ is the intermediate velocity after diffusion and advection Solving Equation 29 and 30 sequentially approximates solving Equation 28 directly. Thus the velocity $\vec{u}$ is approximately equal to $\overrightarrow{u^{(2)}}$. Equation 29 can be discretized and solved numerically by using solvers such as the Gauss-Seidel method. Equation 30 can be discretized and solved numerically by using a Semi-Lagrangian method. The diffusion and advection solving steps are performed in all directions (e.g. both x and y directions for a 2-D problem).

In the second projection step, pressure correction can be achieved using Equation (31).

$$\frac{u^{n+1'} - \overrightarrow{u^{(2)}}}{\Delta t} = -\frac{1}{\rho}\nabla \hat{p}^{n+1} \tag{31}$$

Where $\hat{p}$ is the intermediate pressure. Equation 31 can be rearranged and expressed as shown in Equation (32).

$$\overrightarrow{u^{n+1}} = \overrightarrow{u^{(2)}} - \frac{\Delta t}{\rho}\nabla \hat{p}^{n+1} \tag{32}$$

Taking the divergence on both sides of Equation 32 results in Equation (33).

$$\vec{\nabla} \cdot \overrightarrow{u^{n+1}} = \vec{\nabla} \cdot \overrightarrow{u^{(2)}} - \frac{\Delta t}{\rho}\nabla^2 \hat{p}^{n+1} \tag{33}$$

The velocity field at the new time step should satisfy the mass-conservation equation, substituting $\vec{\nabla} \cdot \overrightarrow{u^{n+1}} = 0$ into Equation 33 and rearranging yields Equation (34).

$$\nabla^2 \hat{p}^{n+1} = \frac{\rho}{\Delta t}\vec{\nabla} \cdot \overrightarrow{u^{(2)}} \tag{34}$$

Equation 34 is essentially a Poisson equation which can be discretized and solved numerically by using solvers such as the Gauss-Seidel method. The final velocity field at time n+1 can be computed by substituting the obtained pressure field into Equation 32.

As with PFM, both 2-D and 3-D FFD analysis can be used to predict perforated tile airflow. Unlike the steady-state PFM, the FFD solver in accordance with at least one embodiment will continuously calculate the flow field progressing from a time 0, simulating the powering on of all CRACs in the room simultaneously, until steady-state conditions are reached. Perforated tile airflow boundary conditions are also updated at every time step and fed back to the FFD solver.

As with PFM, airflow boundary conditions can be modeled as sources (or sinks) located at the corresponding 2-D cells. These airflow sources or sinks can then be treated as the divergence of velocity field as shown in Equation (35).

$$\vec{\nabla} \cdot \overrightarrow{u^{n+1}} = \begin{cases} S''' \\ 0 \end{cases} \tag{35}$$

Where $S'''$ is a volumetric-flow-rate source per unit volume.

The source is then added as an additional term in Equation 34 as shown in Equation (36).

$$\nabla^2 \hat{p}^{n+1} = \frac{\rho}{\Delta t}\vec{\nabla} \cdot \overrightarrow{u^{(2)}} - S''' \tag{36}$$

Equation 36 can still be solved as a Poisson equation as the right-hand side is known. The rest of the calculation is the same as described above: the velocity field is updated, tile airflow is computed, and the process repeats until steady-state is achieved.

There are several ways in different embodiments to determine the plenum pressure distribution based on a known velocity field obtained by the FFD solver.

The first way is the same as with the PAB-C or PFM processes described above, by estimating the relative pressure field p* using the Bernoulli equation. This method is simple to implement; however, use of the Bernoulli Equation with its inherent "idealized flow" assumptions somewhat limits the advantages associated with the more complex flow physics predicted by the FFD method.

A second way to estimate pressure is to utilize the intermediate pressure gradient $\nabla \hat{p}^{n+1}$ directly using one of the cells (e.g. the top left corner cell) as a reference point. Note that the $\nabla \hat{p}$ can be shown to be the actual pressure gradient at steady-state.

The third way to compute pressure is by directly using the Navier-Stokes equation, Equation 26, with a known velocity field substituted. Then, the relative pressure field p* can be derived by, again, assuming a known pressure at one reference point. After the relative pressure field p* is obtained using any of the above mentioned techniques, the FFD solver can then use "pressure correction" technique (discussed earlier) where the corrector pressure p' is varied until a mass balance between CRAC and tile and leakage airflow is achieved.

Figure 14:
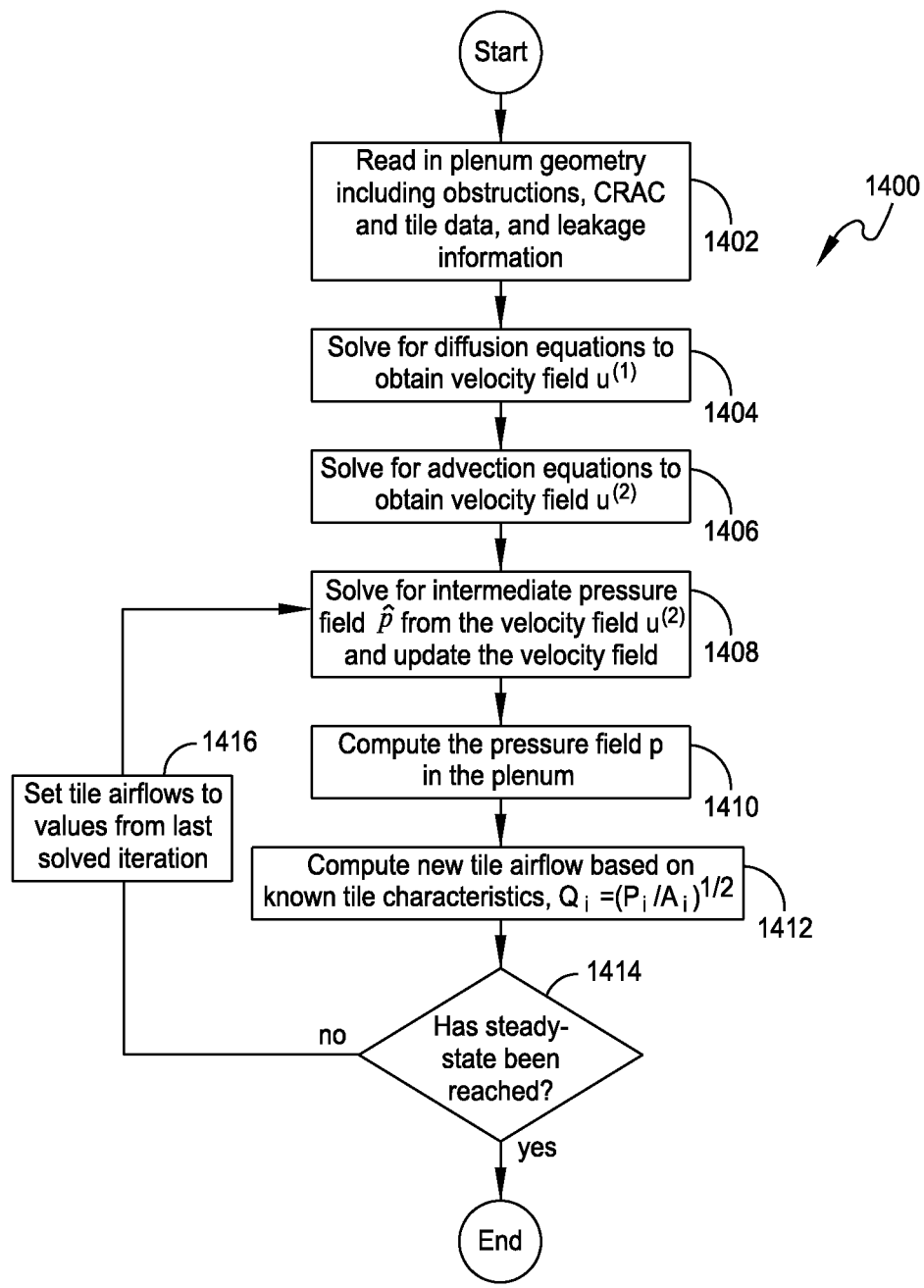
FIG. 14 shows a process for determining airflows in a plenum in accordance with one embodiment.

One embodiment of a process 1400 for determining perforated tile airflows for a plenum using an FFD based method will now be described with reference to FIG. 14. In a first act 1402 of the process 1400, information is read into a system configured to perform the process 1400. The system may be one of the computer systems described above. The information may be read into the system from a storage media, transferred in to the system over a network, and/or entered into the system by a user. In acts 1404 and 1406, the diffusion and advection equations described above are used to obtain velocity fields $u^{(1)}$ and $u^{(2)}$. Next, at act 1408, the intermediate pressure field is determined and the velocity field is updated. At act 1410, the pressure field in the plenum is determined. At act 1412, the airflow for each tile is determined, and at decision block 1414, a determination is made as to whether steady state has been reached. If the outcome of decision block 1414 is YES, then the process ends, and at the last tile airflow values determined in act 1412 are the final airflow values. If the outcome of decision block 1414 is NO, then at act 1416, the airflow values are set equal to the values from the last iteration, and acts 1404 to 1414 are repeated until steady state is achieved and final airflow values are determined. In one embodiment, a 2-D representation of the airflow field can be displayed in real-time during the solving process of each step.

Hybrid Method

Figure 15:
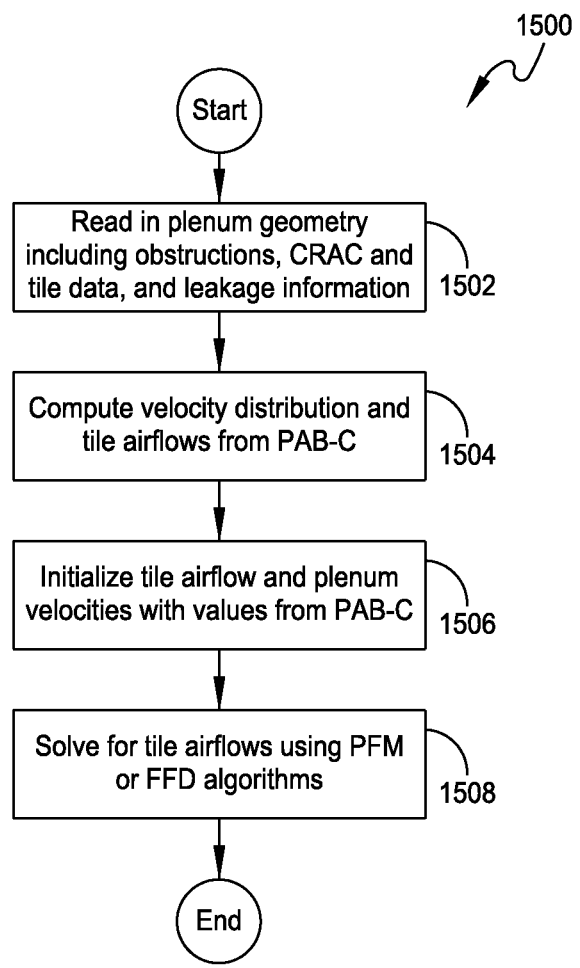
FIG. 15 shows a process for determining airflows in a plenum in accordance with one embodiment.

In one further embodiment, a Hybrid Method is used to determine perforated tile airflows for a plenum. The Hybrid Method combines the PAB-C method with either the PFM method or the FFD method. The final results are equivalent to PFM or FFD respectively; however, the solution time may be reduced by starting with a "better guess" of the velocity field as predicted by PAB-C. The speed improvement depends mainly on the specific layout and the grid system being employed. The "best" layouts from a speed improvement perspective are those for which PAB-C is most accurate like those which feature regular, repeating geometry without "L" shapes or other cutouts and smaller-open-area perforated tiles. The grid system employed by either PFM or FFD also affect the speed-up because as such grids become very efficient it may be less computationally expensive simply to run more iterations than to run the PAB-C solver. The overall reduction in solution time can be as much as approximately 20% for good-for-PAB-C rooms with a uniform 6 inch grid spacing. A process 1500 for determining tile airflows using a Hybrid Method in accordance with one embodiment will now be described with reference to FIG. 15.

In a first act 1502 of the process 1500, information is read into a system configured to perform the process 1500. The system may be one of the computer systems described above. The information may be read into the system from a storage media, transferred in to the system over a network, and/or entered into the system by a user. In act 1504, velocity distribution and tile airflows are determined using the PAB-C method described above. At act 1506, initial tile airflows and plenum velocities are set based on the outcome of act 1504. At act 1508, final tile airflows are determined using one of the PFM or FFD processes described above.

Embodiments described above provide models for estimating perforated tile-airflows in a plenum which can be used in stand alone systems or included in a more comprehensive data center analysis and management system. The different models provide a range of solution accuracy and solution speed. For applications when instantaneous results are not mandatory, PFM and FFD (and their related hybrid options) provide the greatest value. If solution speed must be essentially instantaneous, FNM or PAB-C would be the first choice.

Embodiments described herein provide novel methods and systems for determining airflow from perforated tiles of a below-floor plenum in a data center. The ability to predict airflow accurately in a data center design or management tool in embodiments of the invention facilitates designing robust plenum systems that exhibit good airflow uniformly under different perforated-tile layout configurations. Further, embodiments facilitate avoiding costly trial-and-error solutions in a facility in attempts to achieve tile flow rates. Still further, better accuracy in tile airflow predictions results in improved overall data center cooling analysis and can provide a more energy efficient cooling solution. In at least some embodiments described herein, airflow in a plenum is described as being generated by a CRAC. Systems and methods described herein can be used with other types of sources of air in plenums, including other types of cooling devices and fans. In at least some embodiments, methods are described as determining specific airflows. In at least some embodiments, the determination is a prediction or estimation of actual airflows.

In at least some embodiments of the invention discussed herein, the performance of assessments and calculations in real-time refers to processes that are completed in a matter of a few seconds or less rather than several minutes or longer as can happen with complex calculations, such as those involving typical CFD calculations.

In at least some embodiments described above, the design of a data center and/or actual parameters in a data center are altered based on predicted perforated tile airflow in a data center. The alterations may be implemented to improve the cooling performance and/or may be implemented to provide cost and/or power savings when the performance is found to be within predetermined specifications. For example, the location of perforated tiles may be changed and/or the types of tiles may be changed. Further, based on determined airflow values, a data management system in accordance with one embodiment, may control one or more CRACs to adjust the airflow, and in addition, one or more equipment racks can be controlled to reduce power if the airflow from perforated tiles is not adequate to provide sufficient cooling.

In at least some embodiments described above, tools and processes are provided for determining perforated tile airflow in a data center. In other embodiments, the tools and processes may be used in other types of facilities, and may also be used in mobile applications, including mobile data centers. Further, processes and systems in accordance with embodiments described herein may be used in overhead air plenums, and other types of air plenums. Still further, while embodiments are described as being used with plenums having perforated tiles, other embodiments in accordance with the invention may be used with other types of openings or vents in a plenum for distributing air from the plenum. The term opening as used herein may include a single open area of a plenum such as a vent, a group of vents closely spaced together to effectively act as one opening, or a single perforated tile having many individual open areas.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A computer-implemented method for predicting airflow from a plurality of openings in a plenum, the method comprising:
   (A) receiving input data from a storage device, the input data including data related to the plenum;
   (B) determining an average air pressure in the plenum;
   (C) determining an airflow value for each of the openings based on the average air pressure;
   (D) modeling the plenum as a plurality of computational grid cells, wherein modeling comprises automatically setting a size of each grid cell of the plurality of computational grid cells such that the size of at least one grid cell is different from the size of at least one other grid cell;
   (E) using a first iterative method, determine a value for airflow velocity for each of the grid cells, wherein using the first iterative method further comprises setting a limit for a number of iterations of the first iterative method;

(F) determining an air pressure value at each of the openings based on airflow velocity values determined using the first iterative method;

(G) using a second iterative method, determine a new airflow value for each of the openings based on the air pressure value at each of the openings, wherein setting the limit for the number of iterations of the first iterative method is based on a completed number of iterations of the second iterative method;

(H) determining whether a difference between the new airflow values and previous airflow values is greater than a threshold; and (I) repeating acts (E) through (H) until the difference between the new airflow values and the previous airflow values is not greater than the threshold, and then storing the new airflow value for each of the openings as a final airflow value.

2. The computer implemented method of claim 1, further comprising displaying the final airflow value for each of the openings.

3. The computer implemented method of claim 2, wherein act (D) includes creating a two dimensional model of an obstruction in the plenum.

4. The computer implemented method of claim 1, further comprising controlling at least one of a cooling device and an equipment rack in a data center based on at least one final airflow value.

5. The computer implemented method of claim 1, wherein automatically setting a size includes determining a size of each grid cell of the plurality of computational grid cells based on characteristics of the plenum.

6. The computer implemented method of claim 1, wherein act (E) includes setting a relaxation factor for the first iterative method, and using the relaxation factor in the first iterative method.

7. The computer implemented method of claim 1, further comprising increasing the limit based on an increase in the completed number of iterations of the second iterative method.

8. The computer implemented method of claim 1, wherein act (G) includes determining if airflows in the plenum satisfy a mass balance equation.

9. The computer method of claim 8, further comprising correcting an air pressure value or airflow value directly at each of the openings if the mass balance equation is not met.

10. A system for evaluating airflow in a plenum of a data center, the plenum having a plurality of openings, the system comprising:
a storage device;
a display;
a controller coupled to the storage device and the display and configured to:
receive input data from the storage device, the input data including data related to the plenum;
determine an airflow value for each of the openings based on an initial air pressure value;
model the plenum as a plurality of computational grid cells including at least one grid cell that has a size different from a size of at least one other grid cell;
use a first iterative method to determine a value for airflow velocity for each of the grid cells and an air pressure value at each of the openings based on the determined values for airflow velocity, wherein the controller is further configured to set a limit for a number of iterations of the first iterative method;
use a second iterative method to determine a new airflow value for each of the openings based on the air pressure value at each of the openings, wherein the number of iterations of the first iterative method is based on a completed number of iterations of the second iterative method;
determine whether a difference between the new airflow values and previous airflow values is greater than a threshold; and
continue using the first iterative method and the second iterative method using updated values until the difference between the new airflow values and the previous airflow values is not greater than the threshold, and then storing in the storage device the new airflow value for each of the openings as a final airflow value.

11. The system of claim 10, wherein the controller is further configured to control the display to display the final airflow value for each of the openings.

12. The system of claim 10, wherein the controller is configured to control at least one device based on at least one final airflow value.

13. The system of claim 10, wherein the size of each grid cell of the plurality of computational grid cells is based on characteristics of the plenum.

14. The system of claim 10, wherein the controller is further configured to set a relaxation factor for the first iterative method, and use the relaxation factor in the first iterative method.

15. The system of claim 14, wherein the controller is further configured to increase the limit based on an increase in the completed number of iterations of the second iterative method.

16. The system of claim 10, wherein the controller is further configured to create a two dimensional model of an obstruction in the plenum.

17. A non-transitory computer readable medium having stored thereon sequences of instruction including instructions that will cause a processor to:
receive input data, the input data including data related to a plenum having a plurality of openings;
determine an average air pressure in the plenum;
determine an airflow value for each of the openings based on the average air pressure;
model the plenum as a plurality of computational grid cells including at least one grid cell that has a size different from a size of at least one other grid cell;
use a first iterative method to determine a value for airflow velocity for each of the grid cells and an air pressure value at each of the openings based on the determined values for airflow velocity, wherein the instructions further cause a processor to set a limit for a number of iterations of the first iterative method;
use a second iterative method to determine a new airflow value for each of the openings based on the air pressure value at each of the openings, wherein the limit for the number of iterations of the first iterative method is based on a completed number of iterations of the second iterative method;
determine whether a difference between the new airflow values and previous airflow values is greater than a threshold; and
continue using the first iterative method and the second iterative method using updated values until the difference between the new airflow values and the previous airflow values is not greater than the threshold, and storing the new airflow value for each of the openings as a final airflow value.

18. The non-transitory computer readable medium of claim 17, wherein the size of each grid cell of the plurality of computational grid cells is based on characteristics of the plenum.

* * * * *